(12) United States Patent
Pelzel et al.

(10) Patent No.: US 10,075,143 B2
(45) Date of Patent: Sep. 11, 2018

(54) LAYER STRUCTURES FOR RF FILTERS FABRICATED USING RARE EARTH OXIDES AND EPITAXIAL ALUMINUM NITRIDE

(71) Applicant: IQE, PLC, St. Mellons, Cardiff (GB)

(72) Inventors: Rodney Pelzel, Emmaus, PA (US); Rytis Dargis, Oak Ridge, NC (US); Andrew Clark, Mountain View, CA (US); Howard Williams, Cardiff (GB); Patrick Chin, Zhubei (TW); Michael Lebby, San Francisco, CA (US)

(73) Assignee: IQE, PLC, St. Mellons, Cardiff (GB)

( * ) Notice: Subject to any disclaimer, the term of this patent is extended or adjusted under 35 U.S.C. 154(b) by 0 days.

(21) Appl. No.: 15/342,045

(22) Filed: Nov. 2, 2016

(65) Prior Publication Data

US 2017/0141750 A1    May 18, 2017

Related U.S. Application Data

(60) Provisional application No. 62/398,416, filed on Sep. 22, 2016, provisional application No. 62/255,113, filed on Nov. 13, 2015.

(51) Int. Cl.
*H01L 27/06* (2006.01)
*H03H 1/00* (2006.01)
(Continued)

(52) U.S. Cl.
CPC .......... *H03H 1/0007* (2013.01); *H01L 23/66* (2013.01); *H01L 27/0688* (2013.01);
(Continued)

(58) Field of Classification Search
CPC .......... H03H 1/0007; H03H 3/08; H03H 3/02; H03H 9/175; H01L 27/0688; H01L 23/66;
(Continued)

(56) References Cited

U.S. PATENT DOCUMENTS 6,045,626 A    4/2000  Yano et al.
7,384,481 B2   6/2008  Atanackovic
(Continued)

FOREIGN PATENT DOCUMENTS

WO    WO 02/09160      1/2002
WO    WO 2009/096931   8/2009

OTHER PUBLICATIONS

Invitation to Pay Additional Fees in PCT US/2016/060187, dated Feb. 9, 2017 (8 pages).
(Continued)

*Primary Examiner* — Dao H Nguyen
(74) *Attorney, Agent, or Firm* — Haley Guiliano LLP

(57) ABSTRACT

Layer structures for RF filters can be fabricated using rare earth oxides and epitaxial aluminum nitride, and methods for growing the layer structures. A layer structure can include an epitaxial crystalline rare earth oxide (REO) layer over a substrate, a first epitaxial electrode layer over the crystalline REO layer, and an epitaxial piezoelectric layer over the first epitaxial electrode layer. The layer structure can further include a second electrode layer over the epitaxial piezoelectric layer. The first electrode layer can include an epitaxial metal. The epitaxial metal can be single-crystal. The first electrode layer can include one or more of a rare earth pnictide, and a rare earth silicide (RESi).

47 Claims, 15 Drawing Sheets

(51) Int. Cl.
| | |
|---|---|
| H01L 21/00 | (2006.01) |
| H01L 29/737 | (2006.01) |
| H01L 23/66 | (2006.01) |
| H01L 29/66 | (2006.01) |
| H01L 29/778 | (2006.01) |
| H01L 41/08 | (2006.01) |
| H01L 41/083 | (2006.01) |
| H01L 41/319 | (2013.01) |
| H03H 3/02 | (2006.01) |
| H03H 3/08 | (2006.01) |
| H03H 9/17 | (2006.01) |

(52) U.S. Cl.
CPC .. *H01L 29/66242* (2013.01); *H01L 29/66431* (2013.01); *H01L 29/737* (2013.01); *H01L 29/778* (2013.01); *H01L 41/083* (2013.01); *H01L 41/0815* (2013.01); *H01L 41/319* (2013.01); *H03H 3/02* (2013.01); *H03H 3/08* (2013.01); *H03H 9/175* (2013.01); *H01L 2223/6672* (2013.01); *H03H 2001/0064* (2013.01); *H03H 2001/0085* (2013.01); *H03H 2003/025* (2013.01)

(58) Field of Classification Search
CPC ............. H01L 29/778; H01L 29/66242; H01L 29/66431; H01L 29/737; H01L 41/319; H01L 41/083; H01L 41/0815
USPC .......... 257/76, 190, 195, 415, 416, E29.068, 257/E29.164, E29.272, E21.09, E21.272; 438/478, 50
See application file for complete search history.

(56) References Cited

U.S. PATENT DOCUMENTS

| | | | | |
|---|---|---|---|---|
| 7,605,531 | B1* | 10/2009 | Lebby | H01L 27/156 257/13 |
| 7,643,526 | B1* | 1/2010 | Lebby | H01S 3/0627 372/40 |
| 8,748,900 | B1* | 6/2014 | Dargis | H01L 21/02381 257/76 |
| 8,796,121 | B1 | 8/2014 | Dargis et al. | |
| 8,878,188 | B2* | 11/2014 | Dargis | H01L 21/02192 257/190 |
| 2002/0015852 | A1 | 2/2002 | Noguchi et al. | |
| 2003/0136331 | A1* | 7/2003 | Ami | C30B 23/02 117/2 |
| 2004/0053460 | A1* | 3/2004 | Higuchi | H01L 21/31691 438/200 |
| 2005/0179342 | A1* | 8/2005 | Higuchi | B41J 2/14233 310/324 |
| 2005/0218466 | A1* | 10/2005 | Kondo | G02F 1/035 257/415 |
| 2013/0032858 | A1 | 2/2013 | Clark et al. | |
| 2013/0062610 | A1* | 3/2013 | Clark | H01L 33/10 257/76 |
| 2014/0167057 | A1* | 6/2014 | Arkun | H01L 33/007 257/76 |
| 2015/0236244 | A1 | 8/2015 | Kijima et al. | |
| 2016/0240375 | A1 | 8/2016 | Dargis et al. | |

OTHER PUBLICATIONS

Lebby et al., "Driving 'on-silicon' solutions in lighting, power electronics & PVs," *Semiconductor Today, Compounds & Advanced Silicon*, vol. 6, Issue 8, Oct./Nov. 2011 (4 pages).

Saint-Girons et al., "Monolithic integration of InP based heterostructures on silicon using crystalline $Gd_2O_3$ buffers", *American Institute of Physics*, Applied Physics Letters 91, 241912 (2007) 4 pages.

International Search Report and Written Opinion in PCT Application No. PCT/US2017/022821, dated May 31, 2017, 12 pages.

Gsell et al., "Epitaxial films of metals from the platinum group (Ir, Rh, Pt and Ru) on YSZ-buffered Si(111)," *Elsevier Journal of Crystal Growth*, vol. 311 (2009) 3731-3736.

Krishnaswamy et al., "High-Q FBARs Using Epitaxial AlN Films," *2006 IEEE Ultrasonics Symposium*, (2006) 4 pages.

Moy, "Avago Technologies' FBAR Filter Technology Designed Into Latest Generation of 4G & LTE Smartphones," *Avago Technologies*, Oct. 11, 2012, 4 pages.

Okamoto et al., "Epitaxial growth of AlN on single crystal Mo substrates," *Thin Solid Films*, 516 (2008) 4809-4812, Feb. 2007, 4 pages.

Tanifuji et al., "Discussion of Millimeter Wave FBAR with Very Thin AlN Film Fabricated Using MOCVD Method," *2009 IEEE International Ultrasonics Symposium Proceedings*, 4 pages.

Yang et al., "AlN Epitaxial Film Growth Using MOCVD for a GHz-band FBAR," *Journal of the Korean Physical Society*, vol. 55, No. 3, Sep. 2009, pp. 1132-1135.

Yokoyama et al., "New Electrode Material for Low-loss and High-Q FBAR Filters," *2004 IEEE International Ultrasonics, Ferroelectrics, and Frequency Control Joint 50th Anniversary Conference*, (2004), 4 pages.

Zheng et al., "High Optical Quality Polycrystalline Indium Phosphide Grown on Metal Substrates by Metalorganic Chemical Vapor Deposition," *Journal of Applied Physics* 111, 123112 (2012) 7 pages.

* cited by examiner

LAYER STRUCTURES FOR RF FILTERS FABRICATED USING RARE EARTH OXIDES AND EPITAXIAL ALUMINUM NITRIDE

CROSS-REFERENCE TO RELATED APPLICATIONS

This application claims priority to U.S. Provisional Applications Ser. No. 62/255,113, filed Nov. 13, 2015 and Ser. No. 62/398,416, filed Sep. 22, 2016, of which the entire contents of each are hereby incorporated by reference.

BACKGROUND

RF filters can be evaluated using certain Figures of Merit (FOM). One such FOM is the quality factor (Q) and another such FOM is the effective coupling coefficient ($K^2$). Q is a measure of a material's mechanical losses and is directly related to filter insertion loss. Q is a function of the identity and quality of the piezoelectric material as well as the effectiveness of isolation between the piezoelectric medium and the substrate. $K^2$ is a measure of the effectiveness of piezoelectric coupling and is critical in determining a filter's bandwidth.

Epitaxy, epitaxial growth, and epitaxial deposition refer to growth or deposition of a crystalline layer on a crystalline substrate. The crystalline layer is referred to as an epitaxial layer. The crystalline substrate acts as a template and determines the orientation and lattice spacing of the crystalline layer. The crystalline layer can be, in some examples, lattice matched or lattice coincident. A lattice matched crystalline layer can have the same or a very similar lattice spacing as the top surface of the crystalline substrate. A lattice coincident crystalline layer can have a lattice spacing that is an integer multiple of the lattice spacing of the crystalline substrate. The quality of the epitaxy is based in part on the degree of crystallinity of the crystalline layer. Practically, a high quality epitaxial layer will be a single crystal with minimal defects and few or no grain boundaries. Traditionally, metal contact layers are applied to an epitaxial structure at some point in the upstream processing. With today's complex epitaxial structures often incorporating more than one device functionality, this can require extensive etching and deposition of metals on wafers with a large amount of topography.

SUMMARY

Accordingly, layer structures for RF filters fabricated using rare earth oxides and epitaxial aluminum nitride, and methods for growing the layer structures, are described herein. A layer structure can include an epitaxial crystalline rare earth oxide (REO) layer over a substrate, a first epitaxial electrode layer over the crystalline REO layer, and an epitaxial piezoelectric layer over the first epitaxial electrode layer.

The layer structure can further include a second electrode layer over the epitaxial piezoelectric layer. The first electrode layer can include epitaxial metal. The epitaxial metal can be single-crystal. The first electrode layer can include one or more of a rare earth pnictide and a rare earth silicide (RESi).

The layer structure can further include an amorphous oxide layer between the epitaxial crystalline rare earth oxide layer and the substrate. The layer structure can further include an acoustic mirror structure between the epitaxial crystalline REO layer and the substrate, and the acoustic mirror structure can include alternating crystalline REO and mirror material layers.

The layer structure can further include a second epitaxial crystalline rare earth (RE)-containing layer over the epitaxial piezoelectric layer and one or more device layers over the second epitaxial crystalline RE-containing layer. The one or more device layers can include one or more high electron mobility transistor (HEMT) layers, one or more heterojunction bipolar transistor (HBT) layers, and/or one or more pseudomorphic HEMT (pHEMT) layers.

The layer structure can further include a final epitaxial layer over the second electrode layer, and the final epitaxial layer can contain one or more of a metal silicide, a crystalline REO, a rare earth pnictide, and graphene.

The epitaxial piezoelectric layer can include at least one of aluminum nitride and aluminum scandium nitride.

The second epitaxial crystalline RE-containing layer can include one or more of a REO, a rare earth pnictide, and a RESi.

A density of the crystalline REO layer can be between approximately $5 \times 10^3$ kg/m$^3$ and approximately $15 \times 10^3$ kg/m$^3$, and/or between approximately $7 \times 10^3$ kg/m$^3$ and approximately $10 \times 10^3$ kg/m$^3$.

The layer structure can further include an upper contact layer over the second electrode layer, a lower contact layer over the first electrode layer, and an interconnect over the lower contact layer.

The first electrode layer can include one or more of a compositionally graded layer, and a multi-layer structure.

The layer structure can further include at least one of a rare earth pnictide layer and a RESi layer adjacent to the first electrode layer.

The substrate comprises a silicon substrate, a silicon carbide substrate, and a sapphire substrate.

BRIEF DESCRIPTION OF THE DRAWINGS

The above and other features of the present disclosure, including its nature and its various advantages, will be more apparent upon consideration of the following detailed description, taken in conjunction with the accompanying drawings in which.

DETAILED DESCRIPTION

The systems, devices, and methods described herein include, among other things, layer structures having epitaxial layers that may achieve improved performance for RF filters. The piezoelectric layer in an RF filter stack can be crystalline and epitaxial, so its thickness can be controlled more precisely than if it were polycrystalline. In particular, as layer thickness decreases, epitaxy results in improved thickness control compared to other deposition methods. In addition, an epitaxial piezoelectric layer has higher quality interfaces with adjacent layers than if the piezoelectric layer were polycrystalline. High quality interfaces can result in high Q values for RF filters. Characteristics of high quality interfaces include low defect levels, sharp transitions, and low roughness. Because the epitaxial piezoelectric layer described herein is epitaxial and crystalline, the quality of the bulk piezoelectric material is also higher. This results in increased Q and $K^2$ values, which result in improved performance of the RF filter. In addition, making the RF filter stack and the contact layer crystalline enables them to be used as a template for subsequent epitaxial growth of additional layers such as III-nitride layers that can be used in overlying devices.

Figure 1:
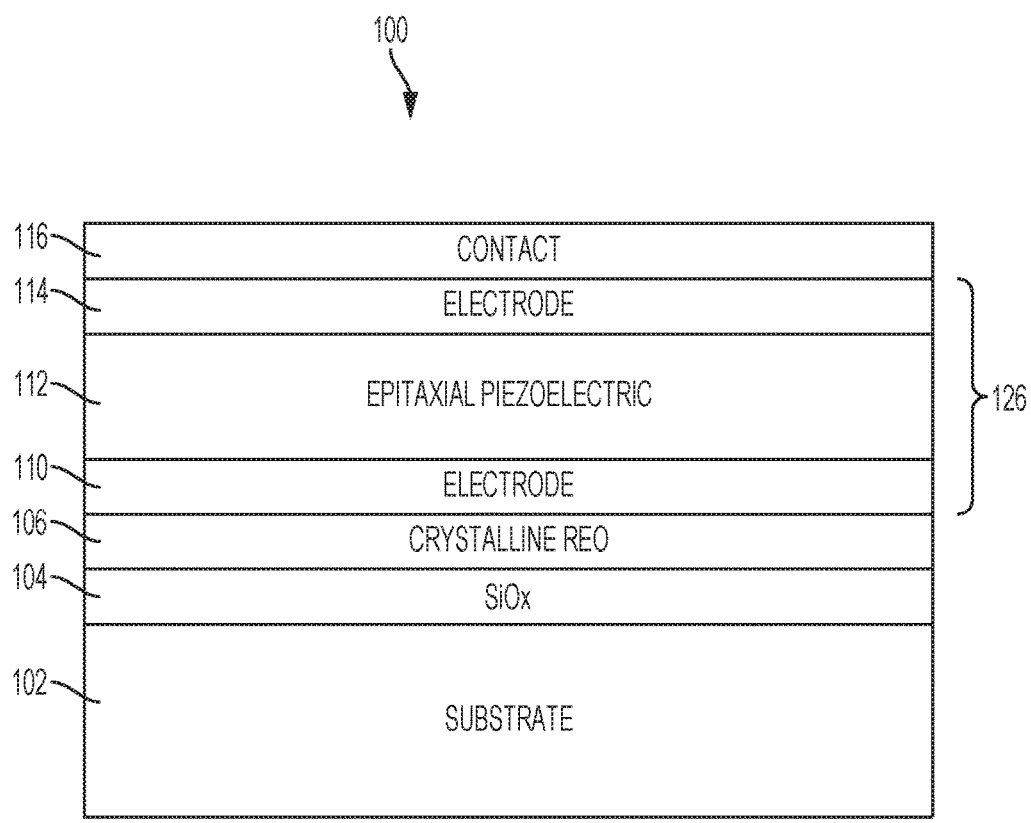
FIG. 1 depicts a layer structure 100 that includes layers for an RF filter, according to an illustrative implementation.

FIG. 1 depicts a layer structure 100 that includes layers for an RF filter. The layer structure 100 includes a substrate 102, a SiOx layer 104 over the substrate 102, and a crystalline REO layer 106 over the SiOx layer 104. The crystalline REO layer is epitaxial with respect to the substrate 102, meaning that the lattice of the crystalline REO layer 106 is nearly lattice-matched or nearly lattice-coincident with the lattice of the substrate 102. The crystalline REO layer 106 can be lattice-matched with the substrate 102, meaning that the two lattices have substantially the same or nearly the same lattice parameters. The crystalline REO layer 106 can also be lattice-coincident with the substrate 102, meaning that one or more lattice parameters of the crystalline REO layer 106 are approximately integer multiples of the corresponding lattice parameters of the substrate 102.

The layer structure 100 also includes a filter stack 126 that is epitaxial with respect to the crystalline REO layer 106, and a contact layer 116 that may be epitaxial with respect to the filter stack 126. The filter stack 126 contains a first electrode layer 110, an epitaxial piezoelectric layer 112, and a second electrode layer 114. Each of the layers in the filter stack 126 is epitaxial. Thus, the first electrode layer 110 is epitaxial with respect to the crystalline REO layer 106, the epitaxial piezoelectric layer 112 is epitaxial with respect to the first electrode layer 110, and the second electrode layer 114 is epitaxial with respect to the epitaxial piezoelectric layer 112. It is noted that the second electrode layer 114 is optional and may be omitted depending on the application and or process flow. One or more interfacial layers (not depicted) may be included between any of the layers in the layer structure 100 as depicted in FIG. 1.

The epitaxial piezoelectric layer 112 can be any material that exhibits a piezoelectric response, such as aluminum nitride, lithium niobate, lithium tantalite, lead zirconium titanate, zinc oxide, magnesium oxide, and aluminum scandium nitride. The thickness of the epitaxial piezoelectric layer 112 can be selected based on Equation 1, which gives the relationship between frequency, sound velocity through the layer, and thickness.

$$f_r = v_s/(2*t_f) \quad [1]$$

where $f_r$ is the frequency, $v_s$ is the velocity of sound through the piezoelectric layer, and $t_f$ is the piezoelectric layer thickness.

The frequency, $f_r$, can be approximately 2.4 GHz, between approximately 2.3-2.7 GHz, between approximately 2-3 GHz, and between approximately 1-4 GHz. The thickness can be approximately 1 μm, between approximately 0.5-1.5 μm, and between approximately 1-10 μm.

Because the epitaxial piezoelectric layer 112 is crystalline and epitaxial, its thickness can be controlled more precisely than if it were polycrystalline. In particular, as layer thickness decreases, epitaxy results in improved thickness control compared to other deposition methods.

The epitaxial piezoelectric layer 112 has higher quality interfaces with adjacent layers than if the piezoelectric layer were polycrystalline. High quality interfaces can result in high Q values for the RF filter. Characteristics of high quality interfaces include low defect levels, sharp transitions, and low roughness.

Because the epitaxial piezoelectric layer 112 is epitaxial and crystalline, the quality of the bulk piezoelectric material is higher. This results in increased Q and $K^2$ values, which result in improved performance of the RF filter.

Figure 2:
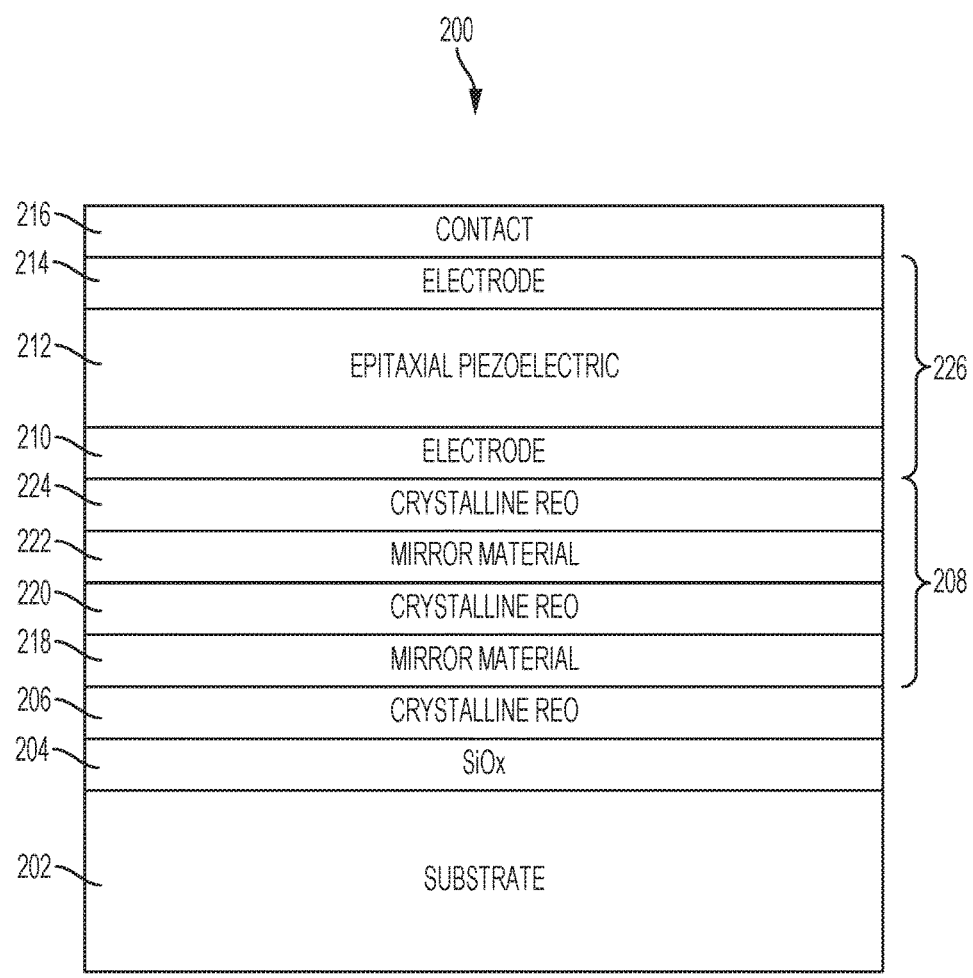
FIG. 2 depicts a layer structure 200 that includes layers for an RF filter, as well as an acoustic mirror, according to an illustrative implementation.

The crystalline REO layer 106 can have a higher acoustic impedance than silicon because of its higher density. Densities of crystalline REO materials can be between approximately $5\times10^3$ kg/m$^3$ and approximately $15\times10^3$ kg/m$^3$, between approximately $7\times10^3$ kg/m$^3$ and approximately $10\times10^3$ kg/m$^3$, and between approximately $7.7\times10^3$ kg/m$^3$ and approximately $9.7\times10^3$ kg/m$^3$. Silicon has a density of approximately $2.6\times10^3$ kg/m$^3$. As such, the crystalline REO layer 106 serves to acoustically isolate the epitaxial piezoelectric layer 112 from the substrate 102, substantially mitigating acoustic wave transmission to the substrate 102. This isolation reduces insertion losses due to the substrate 102. In some examples, the acoustic impedance provided by the crystalline REO layer 106 is sufficient to keep insertion losses at an acceptable level. In some examples, however, an acoustic mirror structure can be used to reduce and/or prevent substrate losses, as shown in FIG. 2.

In instances where the contact layer 116 is crystalline, the full layer stack 100 can be used as a template for subsequent epitaxial growth of additional layers such as III-nitride layers that can be used in overlying devices.

The first and second electrode layers 110 and 114 can comprise one or more of rare earth silicides, rare earth pnictides, and metals. Because the electrode layers 110 and 114 are epitaxial, they have higher conductivity than polycrystalline electrode layers of the same material. The lower resistivity (higher conductivity) enhances the performance of the RF filter. In addition, epitaxial electrode layers enable epitaxial growth of the piezoelectric layer 112. The higher conductivity of epitaxial metals enables the metal electrodes to be thinned while still maintaining adequate conductivity. As frequency increases and the thickness of the piezoelectric layer correspondingly decreases, the thickness of the metal electrodes begin to limit the attainable frequency for the full system. As such, it is desirable to have the electrodes be as thin as possible for a given conductivity.

Epitaxial metals offer a route to achieving thinner electrodes. In some examples, the electrode layers 110 and 114 can be epitaxial metals, as described with reference to FIGS. 9-22.

In one particular example, a crystalline rare earth oxide (REO) layer can be epitaxially grown over a substrate or semiconductor, and a metal layer can be epitaxially grown over the crystalline REO layer. A REO layer is a layer that contains one or more rare earth (RE) species and oxygen. The rare earth species include Lanthanum (La), Cerium (Ce), Praseodymium (Pr), Neodymium (Nd), Promethium (Pm), Samarium (Sm), Europium (Eu), Gadolinium (Gd), Terbium (Tb), Dysprosium (Dy), Holmium (Ho), Erbium (Er), Thulium (Tm), Ytterbium (Yb), Luthium (Lu), Scandium (Sc) and Yttrium (Y).

Rare-earth oxides are known to exhibit fluorite-type structures. These structures exhibit morphology differences as a function of the atomic weight of the rare-earth cation present in the oxide, among any other factors.

In particular, oxides comprising lighter rare-earths form cubic CaF$_2$-type crystal structure as a result of possible ionization states of +2 and/or +3 and/or +4. Oxides having this crystal structure exhibit significant net charge defect due to a multiplicity of possible oxidation states (for rare-earth oxides). On the other hand, oxides formed from heavier rare-earths (e.g., RE$_2$O$_3$, etc.), exhibit a distorted CaF$_2$-type crystal structure which includes anion vacancies due to an ionization state of RE<3+>. The crystal structure associated with rare-earth oxides of heavier rare earths is also known as "Bixbyite."

An illustrative example of a rare-earth oxide having the formula RE$_2$O$_3$, is Er$_2$O$_3$. The crystal structure of a unit cell of Er$_2$O$_3$ is an oxygen-vacancy-derived fluorite derivative (i.e., Bixbyite structure). REO dielectric layers can comprise an assemblage of these unit cells.

The number and position of the anion vacancies determines the crystal shape of the RE$_2$O$_3$ unit cell. The crystal shape of this cell can be engineered to provide a suitable match to the lattice constant of the underlying semiconductor substrate. Oxygen vacancies along the body diagonal and/or the face diagonal lead to a C-type cubic structure. For example, two anion vacancies per fluorite unit cell causes the unit cell of Er$_2$O$_3$ to increase to nearly twice the unit cell size of Si. This, in turn, enables low-strain, single-phase Er$_2$O$_3$ to be epitaxially grown directly on a silicon substrate.

Furthermore, the number and position of the anion vacancies can be engineered to induce a desired strain (tensile or compressive) in the dielectric layer and/or overgrown layers. For example, in some embodiments, strain in the semiconductor layer is desired in order to affect carrier mobility.

Each fluorite unit cell has two oxygen vacancies, which lie along the body diagonal. The presence of these two oxygen vacancies causes the Er$_2$O$_3$ unit cell to double in size, thereby doubling its lattice constant, which provides a suitable match to the lattice constant of <100> silicon.

In some examples, oxygen vacancies lie at the ends of the face diagonal. In some other examples, oxygen vacancies are distributed between the ends of the face diagonal and the body diagonal.

Because the crystalline REO layer 106 is epitaxial and crystalline, it provides a template for epitaxial growth of the overlying layers. In addition, because the crystalline REO layer can be grown on a silicon substrate, it allows overlying epitaxial layers to be grown on silicon.

The SiOx layer 104 is an amorphous oxide of silicon. The SiOx layer 104 may have the chemical formula SiO$_2$, or it may have a different stoichiometry. The SiOx layer 104 provides compliance between the crystalline REO layer 106 and the substrate layer 102. Thus, the SiOx layer 104 absorbs strain rather than transferring it between the adjacent layers. This reduces concavity or convexity in the layer structure 100 after deposition of all of the layers. The SiOx layer 104 is optional and in some examples is not part of the layer structure 100. The SiOx layer 104 can be deposited using silicon and oxygen precursors, or it can form through oxidation of the substrate 102 if the top layer of the substrate 102 contains silicon. Despite the fact that the SiOx layer 104 is amorphous, the crystalline REO layer 106 can still be epitaxial and registered to the lattice of the substrate 102. Thus, the SiOx layer 104 provides compliance and reduces strain in the layer structure 100 without preventing epitaxial growth of overlying layers.

The substrate 102 can be a silicon <111> substrate, a silicon <100> substrate, a silicon substrate of another orientation, a germanium substrate, a silicon carbide substrate, a sapphire substrate, a silicon-on-insulator (SOI) substrate, or another semiconducting or insulating substrate. The substrate 102 can be a miscut substrate, or its orientation can be aligned with a crystal lattice vector.

The layer structure 100 can be included in an RF filter. In particular, the filter stack 126 serves as the active portion of the layer structure 100, and when an RF voltage is applied between the electrodes 110 and 114, the epitaxial piezoelectric layer 112 acoustically resonates and selectively passes the desired frequencies between the electrodes, resulting in a band-pass filter.

FIG. 2 depicts a layer structure 200 that includes layers for an RF filter, as well as an acoustic mirror. The layer structure 200 is an epitaxial structure and comprises a substrate 202, a SiOx layer 204 over the substrate 202, a crystalline REO layer 206 over the SiOx layer 204, an acoustic mirror stack 208 over the crystalline REO layer 206, a filter stack 226 over the acoustic mirror stack 208, and a contact layer 216 over the filter stack 226.

The substrate 202 can be a silicon <111> substrate, a silicon <100> substrate, a silicon substrate of another orientation, a germanium substrate, a silicon carbide substrate, a sapphire substrate, a silicon-on-insulator (SOI) substrate, or another semiconducting or insulating substrate. The substrate 202 can be a miscut substrate, or its orientation can be aligned with a crystal lattice vector.

The SiOx layer 204 is an amorphous oxide of silicon. The SiOx layer 204 may have the chemical formula $SiO_2$, or it may have a different stoichiometry. The SiOx layer 204 provides compliance between the crystalline REO layer 206 and the substrate layer 202. Thus, the SiOx layer 204 absorbs strain rather than transferring it between the adjacent layers. This reduces concavity or convexity in the layer structure 200 after deposition of all of the layers. The SiOx layer 204 is optional and in some examples is not part of the layer structure 200. If included, the SiOx layer 204 is formed by interrupting the REO deposition process and depositing amorphous Si (a-Si) on the upper REO surface. Over this layer the REO deposition process is then resumed. SiOx is formed from the a-Si by either introducing an O anneal at this stage or by an elevated temperature later in the process as described in U.S. application Ser. No. 15/031,504, the entirety of which is hereby incorporated by reference. A crystal registry is established between the REO and the underlying silicon substrate. Note in some examples the initial REO layer will be consumed by the formation of the SiOx leading to an amorphous layer that contains some amorphous RESiOx, a rare earth silicate. Thus, the SiOx layer 204 provides compliance and reduces strain in the layer structure 200 without preventing epitaxial growth of overlying layers.

The layer structure 200 also includes a filter stack 226 that is epitaxial with respect to the acoustic mirror stack 208, and a contact layer 216 that may be epitaxial with respect to the filter stack 226. The filter stack 226 contains a first electrode layer 210, an epitaxial piezoelectric layer 212, and a second electrode layer 214. Each of the layers in the filter stack 226 is epitaxial. Thus, the first electrode layer 210 is epitaxial with respect to the second crystalline REO mirror layer 224, the epitaxial piezoelectric layer 212 is epitaxial with respect to the first electrode layer 210, and the second electrode layer 214 is epitaxial with respect to the epitaxial piezoelectric layer 212. When the contact layer 216 is epitaxial with respect to the filter stack 226, the contact layer 216 is epitaxial with respect to the second electrode 214.

The first and second electrode layers 210 and 214 can comprise one or more of rare earth silicides, rare earth pnictides, and metals. Because the electrode layers 210 and 214 are epitaxial, they have higher conductivity than polycrystalline electrode layers of the same material. The lower resistivity (higher conductivity) enhances the performance of the RF filter. In addition, epitaxial electrode layers enable epitaxial growth of the piezoelectric layer 212. The higher conductivity of epitaxial metals enables the metal electrodes to be thinned while still maintaining adequate conductivity. As frequency increases and the thickness of the piezoelectric layer correspondingly decreases, the thickness of the metal electrodes begin to limit the attainable frequency for the full system. As such, it is desirable to have the electrodes be as thin as possible for a given conductivity. In some examples, the electrode layers 210 and 214 can be epitaxial metals, as described with reference to FIGS. 9-22.

The layer structure 200 can be included in an RF filter. In particular, the filter stack 226 serves as the active portion of the layer structure 200, and when an RF voltage is applied between the electrodes 210 and 214, the epitaxial piezoelectric layer 212 acoustically resonates and selectively passes the desired frequencies between the electrodes, resulting in a band-pass filter.

The crystalline REO layer is epitaxial with respect to the substrate 202, meaning that the lattice of the crystalline REO layer 206 is lattice-matched or lattice-coincident with the lattice of the substrate 202. The crystalline REO layer 206 can be lattice-matched or nearly lattice-matched with the substrate 202, meaning that the two lattices have substantially the same lattice parameters. The crystalline REO layer 206 can also be lattice-coincident or nearly lattice-coincident with the substrate 202, meaning that one or more lattice parameters of the crystalline REO layer 206 are integer multiples of the corresponding lattice parameters of the substrate 202.

An acoustic mirror stack has a high acoustic impedance and prevents or substantially reduces propagation of acoustic waves across its thickness. The acoustic mirror stack 208 has a high acoustic impedance and prevents or substantially reduces propagation of acoustic waves from the epitaxial piezoelectric layer 212 into the substrate 202. The acoustic mirror stack 208 comprises a first mirror material layer 218, a first crystalline REO mirror layer 220, a second mirror material layer 222, and a second crystalline REO mirror layer 224. The first and second mirror material layers 218 and 222 can be any material with a density significantly different than the adjacent crystalline REO layers. Some examples of materials that can be used for the mirror material layers 218 and 222 are silicon and metals. Densities of crystalline REO materials can be between approximately $5 \times 10^3$ $kg/m^3$ and approximately $15 \times 10^3$ $kg/m^3$, between approximately $7 \times 10^3$ $kg/m^3$ and approximately $10 \times 10^3$ $kg/m^3$, and between approximately $7.7 \times 10^3$ $kg/m^3$ and approximately $9.7 \times 10^3$ $kg/m^3$. Silicon has a density of approximately $2.6 \times 10^3$ $kg/m^3$. Thus, the crystalline REO mirror layers 220 and 224 can have densities that are larger than the mirror material layers 218 and 222 by a factor of at least 1.5, at least 2, at least 3, at least 4, and at least 5.

The crystalline REO mirror layers 220 and 224 can comprise the same material, or they can comprise different materials. In addition, the crystalline REO mirror layers 220 and 224 can comprise the same material as the crystalline REO layer 206, or they can comprise different materials. The mirror material layers 218 and 222 can comprise the same mirror materials, or they can comprise different mirror materials. While the acoustic mirror 208 comprises two crystalline REO mirror layers and two mirror material layers, the acoustic mirror stack 208 can comprise different numbers of layers than depicted in FIG. 2. In addition, the acoustic mirror stack 208 can comprise layers in a different order than depicted in FIG. 2. For example, a crystalline REO layer may be the lowermost layer of the acoustic mirror stack 208, and/or a mirror material layer can be the uppermost layer of the acoustic mirror stack 208. In addition, one or more interfacial layers may be included between the crystalline REO layer 206 and the acoustic mirror stack 208, between the acoustic mirror stack 208 and the filter stack 226, and between the filter stack 226 and the contact layer 216. Because the acoustic mirror stack 208 includes alternating layers with different densities, propagation of acoustic waves from the filter stack 226 to the substrate 202 is substantially reduced or prevented. This reduces insertion loss of the layer structure 200. The acoustic mirror stack 208 can act as an optical mirror and/or as a Bragg reflector.

Figure 3:
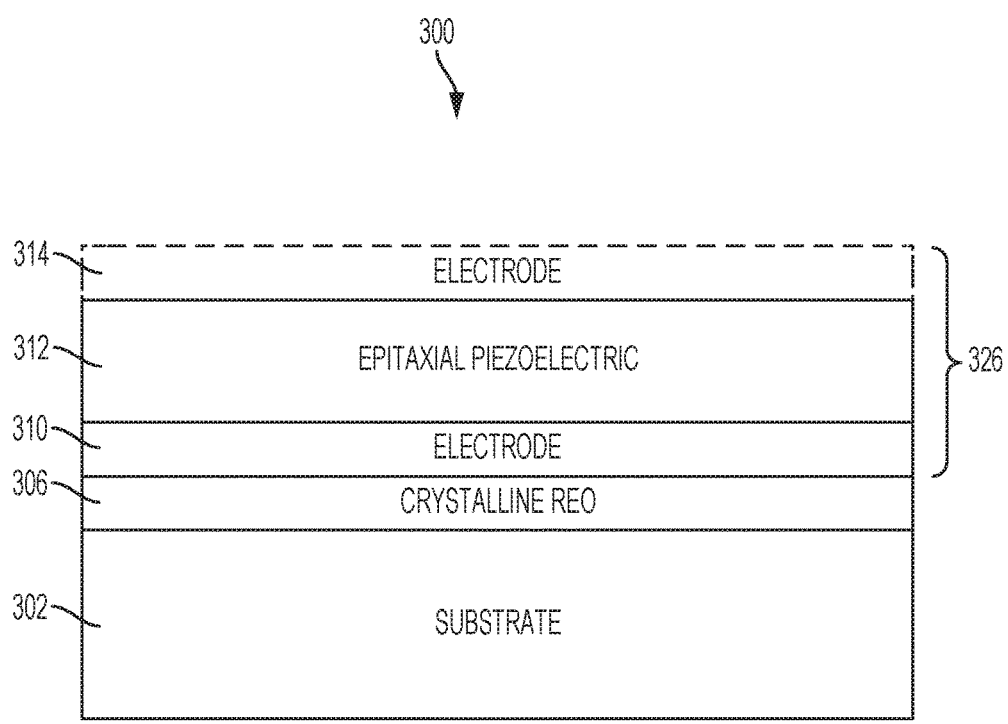
FIG. 3 depicts a layer structure 300 that includes layers for an RF filter, according to an illustrative implementation.

FIG. 3 depicts a layer structure 300 that includes layers for an RF filter. The layer structure 300 includes a substrate 302, a crystalline REO layer 306 over the substrate 302, and a filter stack 326 over the crystalline REO layer 306. The layer structure 300 can include one or more optional intervening layers (not depicted) between any of the layers depicted in FIG. 3. An example of such an optional intervening layer is an amorphous oxide (e.g., SiOx) layer between the crystalline REO layer 306 and the substrate 302. The filter stack 326 comprises a first electrode layer 310 over the crystalline REO layer 306, an epitaxial piezoelectric layer 312 over the first electrode layer 310, and a second electrode layer 314 over the epitaxial piezoelectric layer 312.

The substrate 302 can be a silicon <111> substrate, a silicon <100> substrate, a silicon substrate of another orientation, a germanium substrate, a silicon carbide substrate, a sapphire substrate, a silicon-on-insulator (SOI) substrate, or another semiconducting or insulating substrate. The substrate 302 can be a miscut substrate, or its orientation can be aligned with a crystal lattice vector.

The layer structure 300 can be included in an RF filter. In particular, the filter stack 326 serves as the active portion of the layer structure 300, and when an RF voltage is applied between the electrodes 310 and 314, the epitaxial piezoelectric layer 312 acoustically resonates and selectively passes the desired frequencies between the electrodes, resulting in a band-pass filter.

The crystalline REO layer is epitaxial with respect to the substrate 302, meaning that the lattice of the crystalline REO layer 306 is lattice-matched (or nearly lattice matched) or lattice-coincident (or nearly lattice-coincident) with the lattice of the substrate 302. The crystalline REO layer 306 can be lattice-matched or nearly lattice matched with the substrate 302, meaning that the two lattices have substantially the same lattice parameters. The crystalline REO layer 306 can also be lattice-coincident or nearly lattice coincident with the substrate 302, meaning that one or more lattice parameters of the crystalline REO layer 306 are integer multiples of the corresponding lattice parameters of the substrate 302.

The layer structure 300 also includes a filter stack 326 that is epitaxial with respect to the crystalline REO layer 306. The filter stack 326 contains a first electrode layer 310 and an epitaxial piezoelectric layer 312. In some examples, the filter stack 326 can contain an optional second electrode layer 314. Each of the layers in the filter stack 326 is epitaxial. Thus, the first electrode layer 310 is epitaxial with respect to the crystalline REO layer 306, and the epitaxial piezoelectric layer 312 is epitaxial with respect to the first electrode layer 310. The optional second electrode layer 314 may be epitaxial with respect to the epitaxial piezoelectric layer 312, or it may not be epitaxial.

Figure 4:
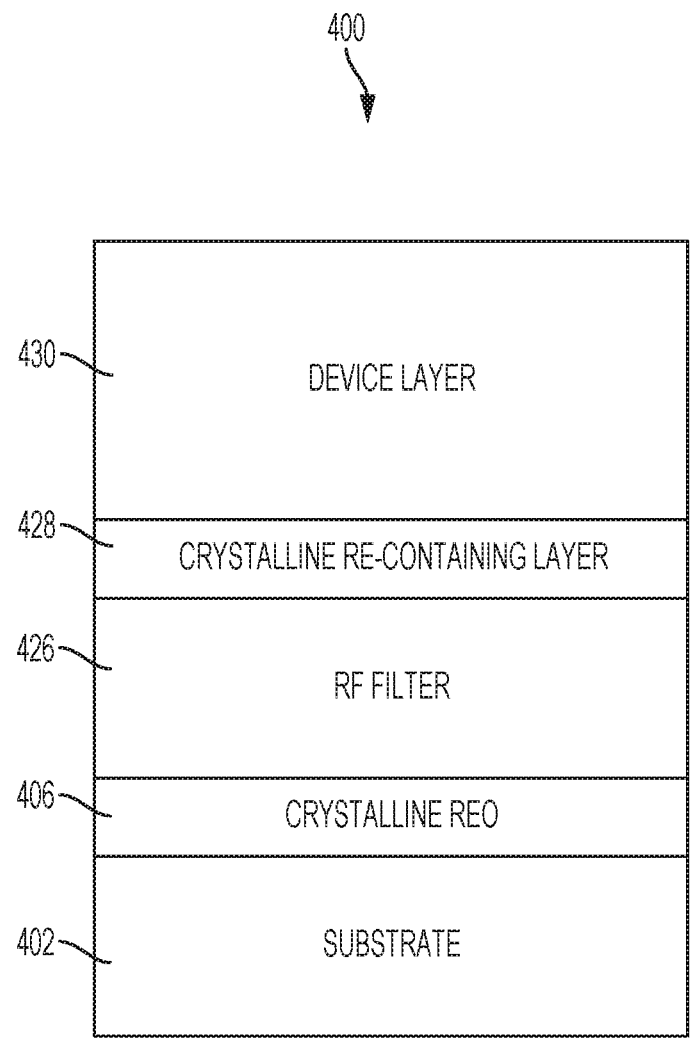
FIG. 4 depicts a layer structure 400 that includes device layers overlying RF filter layers, according to an illustrative implementation.

FIG. 4 depicts a layer structure 400 that includes device layers overlying RF filter layers. The layer structure 400 includes a substrate 402, a crystalline REO layer 406 over the substrate 402, and an RF filter layer structure 426 over the crystalline REO layer 406. The layer structure 400 also includes a crystalline RE-containing layer 428 over the RF filter layer structure 426 and a device layer 430 over the crystalline RE-containing layer 428. The device layer 430 can include one or more sub-layers (not shown). The device layer 430 can include one or more III-nitride layers, one or more gallium nitride-based high electron mobility transistor (HEMT) layers, one or more III-V-based heterojunction bipolar transistor (HBT) layers, and/or one or more III-V-based pseudomorphic HEMT (pHEMT) layers. Because the layer structure 400 includes one or more device layers 430 over the RF filter layer structure 426, the overall footprint of an integrated system having RF filters and other devices such as those described above can be significantly reduced.

The layer structure 400 can also include an optional SiOx layer (not shown) between the crystalline REO layer 406 and the substrate 402 to provide compliance, and/or an acoustic mirror stack between the crystalline REO layer 406 and the RF filter layer structure 426. In addition, one or more interfacial layers (not depicted) may be included between any of the layers in the layer structure 400 as depicted in FIG. 4.

The crystalline RE-containing layer 428 is epitaxial with respect to the RF filter layer structure 426. The crystalline RE-containing layer 428 can include one or more of a rare earth oxide, a rare earth pnictide (a combination of RE and a group V element—N, P, As, Sb, or Bi) or another material containing rare earth species. To list several examples, the crystalline RE-containing layer 428 can comprise one or more RE-containing materials such as scandium nitride, erbium nitride, erbium oxide, scandium oxide, erbium arsenide, erbium phosphide, scandium arsenide, scandium phosphide, and/or other materials containing rare earth species. The crystalline RE-containing layer 428 can comprise one or more sub-layers, or can be compositionally graded through its thickness. Compositionally graded means that the crystalline RE-containing layer 428 changes in composition through its thickness from one RE-containing material to another RE-containing material. This compositional grading can bridge between different lattice constants for the device layer 430 and the RF filter layer structure 426. In particular, the top surface of the crystalline RE-containing layer 428 may be scandium nitride, as its lattice constant is nearly the same as the lattice constant of gallium nitride. In this example, the device layer 430 can comprise one or more gallium nitride layers. The bottom surface of the crystalline RE-containing layer 428 can be comprised of a material that is lattice-matched or lattice-coincident with the top surface of the RF filter layer structure 426. Thus, the crystalline RE-containing layer 428 provides a transition between the lattice structure and parameters of the top surface of the RF filter layer structure 426 and the bottom surface of the device layer 430. In some examples, the crystalline RE-containing layer can contain multiple discrete layers, and/or can contain a superlattice or other multi-layer structure. A multi-layer structure is a layer structure that contains multiple layers, often with repeating sets of materials.

The substrate 402 can be a silicon <111> substrate, a silicon <100> substrate, a silicon substrate of another orientation, a germanium substrate, a silicon carbide substrate, a sapphire substrate, a silicon-on-insulator (SOI) substrate, or another semiconducting or insulating substrate. The substrate 402 can be a miscut substrate, or its orientation can be aligned with a crystal lattice vector.

The crystalline REO layer 406 is epitaxial with respect to the substrate 402, meaning that the lattice of the crystalline REO layer 406 is lattice-matched (or nearly lattice matched) or lattice-coincident (or nearly lattice coincident) with the lattice of the substrate 402. The crystalline REO layer 406 can be lattice-matched or nearly lattice matched with the substrate 402, meaning that the two lattices have substantially the same lattice parameters. The crystalline REO layer 406 can also be lattice-coincident or nearly lattice coincident with the substrate 402, meaning that one or more lattice parameters of the crystalline REO layer 406 are integer multiples of the corresponding lattice parameters of the substrate 402.

The filter stack 426 can include a first electrode layer (not shown), an epitaxial piezoelectric layer (not shown), and a second electrode layer (not shown). Each of the layers in the filter stack 426 is epitaxial. Thus, the first electrode layer is epitaxial with respect to the crystalline REO layer 406, the epitaxial piezoelectric layer is epitaxial with respect to the first electrode layer, and the second electrode layer is epitaxial with respect to the epitaxial piezoelectric layer. The filter stack 426 can be the same as any of the filter stacks 126, 226, and 326.

The filter stack 426 can be included in an RF filter. In particular, the filter stack 426 serves as the active portion of the RF filter, and when an RF voltage is applied between the first and second electrode layers, the epitaxial piezoelectric layer acoustically resonates and selectively passes the desired frequencies between the electrodes, resulting in a band-pass filter.

The device layer 430 is epitaxial with respect to the crystalline RE-containing layer 428. Because the crystalline RE-containing layer 428, the RF filter layer structure 426, and the crystalline REO layer 406 are epitaxial, they serve as a template for epitaxial growth of subsequent layers, such as the device layer 430. Thus, crystalline device layers can be grown over RF filter layers, without suffering any reduction in crystallinity or material quality. By combining an overlying epitaxial device layer 430 over an underlying RF filter layer structure 426, the layer structure 400 allows for greater device functionality within a given footprint.

Figure 5:
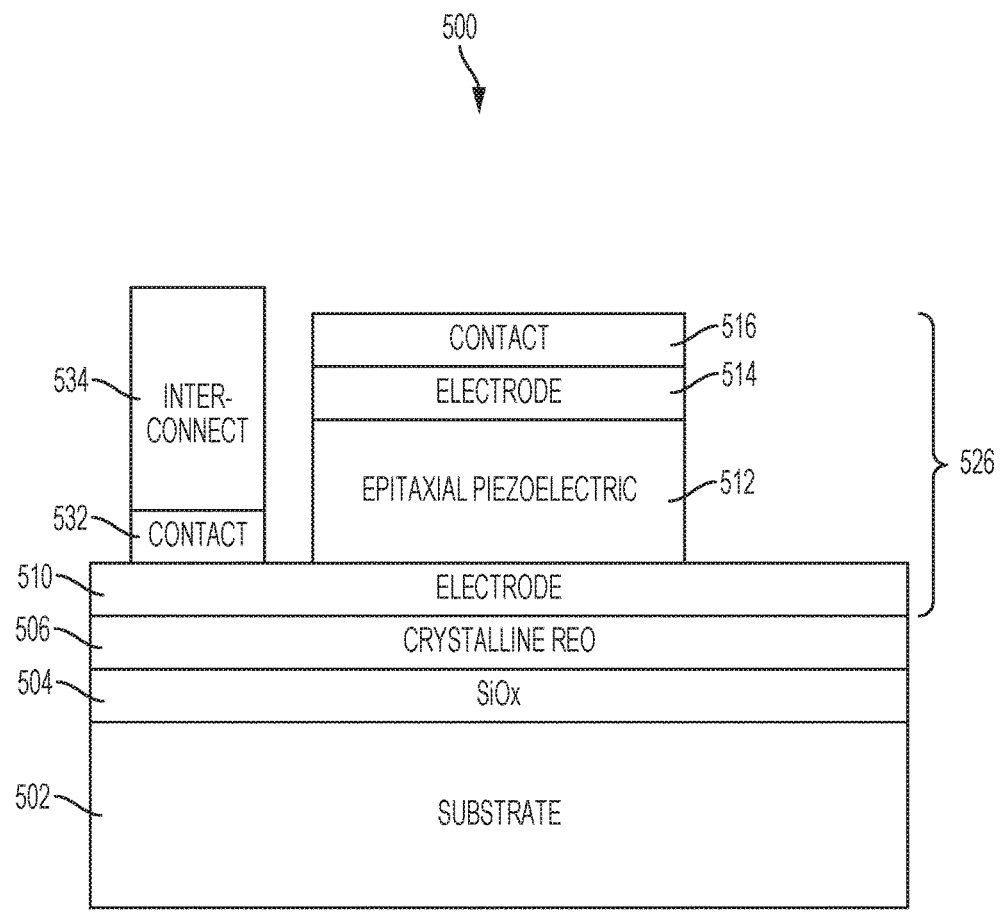
FIG. 5 depicts a layer structure 500 (that includes an RF filter stack) after patterning to contact both electrodes, according to an illustrative implementation.

FIG. 5 depicts a layer structure 500 (that includes an RF filter stack) after patterning to contact both electrodes. The layer structure 500 includes a substrate 502, an optional SiOx layer 504 over the substrate 502, and a crystalline REO layer 506 over the SiOx layer 504. The layer structure 500 also includes a filter stack 526 over the crystalline REO layer 506. The filter stack 526 includes a first electrode layer 510 over the crystalline REO layer 506, and epitaxial piezoelectric layer 512 over the first electrode layer 510, and a second electrode layer 514 over the epitaxial piezoelectric layer 512. Layer 514 is optional and may or may not be part of the structure. In addition, the layer structure 500 includes an upper contact layer 516 over the second electrode 514. The layer structure 500 also includes a lower contact layer 532 over a portion of the first electrode 510 and an interconnect 534 over the lower contact layer 532.

The filter stack 526 is epitaxial with respect to the crystalline REO layer 506, and layers 510, 512, and 514 are epitaxial. Layer 516 may or may not be epitaxial. Thus, the first electrode layer 510 is epitaxial with respect to the crystalline REO layer 506, the epitaxial piezoelectric layer 512 is epitaxial with respect to the first electrode layer 510, and the second electrode layer 514 is epitaxial with respect to the epitaxial piezoelectric layer 512.

The substrate 502 can be a silicon <111> substrate, a silicon <100> substrate, a silicon substrate of another orientation, a germanium substrate, a silicon carbide substrate, a sapphire substrate, a silicon-on-insulator (SOI) substrate, or another semiconducting or insulating substrate. The substrate 502 can be a miscut substrate, or its orientation can be aligned with a crystal lattice vector.

The SiOx layer 504 is an amorphous oxide of silicon. The SiOx layer 504 may have the chemical formula $SiO_2$, or it may have a different stoichiometry. The SiOx layer 504 provides compliance between the crystalline REO layer 506 and the substrate layer 502. Thus, the SiOx layer 504 absorbs strain rather than transferring it between the adjacent layers. This reduces concavity or convexity in the layer structure 500 after deposition of all of the layers. The SiOx layer 504 is optional and in some examples is not part of the layer structure 500. If included, the SiOx layer 504 is formed by interrupting the REO deposition process and depositing a-Si on the upper REO surface. Over this layer the REO deposition process is then resumed. SiOx is formed from the a-Si by either introducing an O anneal at this stage or by an elevated temperature later in the process as described in U.S. application Ser. No. 15/031,504, the entirety of which is hereby incorporated by reference. A crystal registry is established between the REO and the underlying silicon substrate. Note in some examples the initial REO layer will be consumed by the formation of the SiOx leading to an amorphous layer that contains some amorphous RESiOx, a rare earth silicate. Thus, the SiOx layer 504 provides compliance and reduces strain in the layer structure 500 without preventing epitaxial growth of overlying layers.

The layer structure 500 can be included in an RF filter. In particular, the filter stack 526 serves as the active portion of the layer structure 500, and when an RF voltage is applied between the electrodes 510 and 514, the epitaxial piezoelectric layer 512 acoustically resonates and selectively passes the desired frequencies between the electrodes, resulting in a band-pass filter.

The crystalline REO layer 506 is epitaxial with respect to the substrate 502, meaning that the lattice of the crystalline REO layer 506 is lattice-matched (or nearly lattice-matched) or lattice-coincident (or nearly lattice coincident) with the lattice of the substrate 502. The crystalline REO layer 506 can be lattice-matched or nearly lattice matched with the substrate 502, meaning that the two lattices have substantially the same lattice parameters. The crystalline REO layer 506 can also be lattice-coincident or nearly lattice coincident with the substrate 502, meaning that one or more lattice parameters of the crystalline REO layer 506 are integer multiples of the corresponding lattice parameters of the substrate 502.

When the contact layer 516 is epitaxial with respect to the filter stack 526, the contact layer 516 is epitaxial with respect to the second electrode 514.

Figure 6:
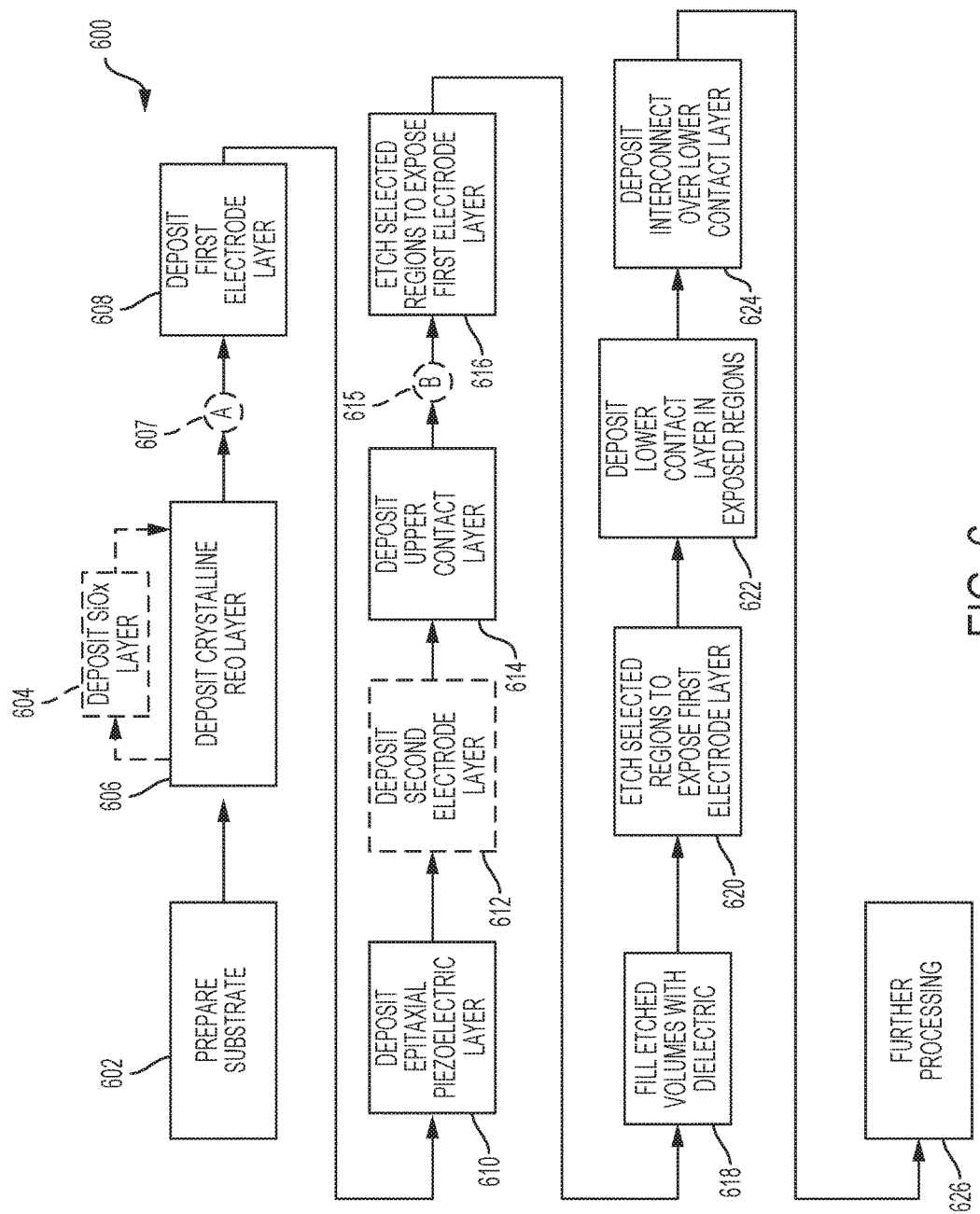
FIG. 6 depicts a flowchart of a method 600 for depositing layer structures for use as RF filters, according to an illustrative implementation.

FIG. 6 depicts a flowchart of a method 600 for depositing layer structures for use as RF filters. At 602, a substrate is prepared. Preparing the substrate can include one or more of pre-cleaning the substrate, degassing the substrate, etching the substrate, loading the substrate into a deposition system, and thermally treating the substrate. The substrate can be any of the substrates 102, 202, 302, 402, and 502. At 606 a crystalline REO layer is deposited. The crystalline REO layer can be adjacent to an optional SiOx layer, it can be adjacent to the substrate, and/or it can be adjacent to another intervening layer. The crystalline REO layer can be any of the crystalline REO layers 106, 206, 306, 406, and 506. If a SiOx layer is to be included, step 606 (the REO process) is interrupted and the method proceeds to optional step 604, in which a-Si is deposited on the upper REO surface. The step 604 is optional because in some examples, the layer structure does not include a SiOx layer, and in other examples, the SiOx layer is formed by other means. The SiOx layer can be any of the SiOx layers 104, 204, and 504. Then, step 606 (the REO deposition process) is resumed. In some examples, the method 600 proceeds to optional method 607 in which an acoustic mirror layer structure is deposited. The method 607 is further described with reference to FIG. 7.

After step 606, or if included, optional method 607, the method 600 proceeds to step 608. At 608, a first electrode layer is deposited. At 610, an epitaxial piezoelectric layer is deposited. At optional step 612, a second electrode layer is deposited. At 614, an upper contact layer is deposited over the second electrode layer.

After step 614, the method 600 can optionally proceed to the method 615, in which overlying devices are deposited. The method 615 is further described with reference to FIG. 8.

After step 614, or if included, the method 615, the method 600 proceeds to 616. At 616, selected regions are etched to expose a first electrode layer. However, in other regions not selected, the epitaxial piezoelectric layer, the second electrode layer, and the upper contact layer are not etched and remain as mesas. At 618, the volumes etched in 616 are filled with a dielectric material. This dielectric material is a material with a high dielectric constant that isolates the mesas from one another. At 620, selected regions of the dielectric are etched to expose again the first electrode layer. This has the effect of opening vias through the dielectric. At 622, a lower contact layer is deposited over the first electrode layer and the exposed regions that were etched in step 620. At 624, an interconnect is deposited over the lower contact layer. At step 626, further processing may be performed. Further processing can include one or more of a capping layer, further deposition, further etching, packaging, and other processing steps.

Steps other than those shown can be performed as part of the method 600. For example, intervening layers can be deposited between any of the layers described in FIG. 6. Steps in the method of 600 can be performed in a different order other than the order depicted in FIG. 6. Also, not all of the steps of the method 600 need to be performed. For example, the layer structure 100 can be fabricated using steps 602, 604, 606, 608, 610, 612, and 614. As another example, the layer structure 200 can be fabricated using steps 602, 604, 606, 607, 608, 610, 612, and 614. Furthermore, the layer structure 300 can be deposited using steps 602, 606, 608, 610, and optionally 612. The layer structure 400 can be fabricated using steps 602, 606, 608, 610, 612, and 615. The layer structure 500 can be deposited using steps 602, 604, 606, 608, 610, 612, 614, 616, 618, 620, 622, 624, and 626.

Figure 7:
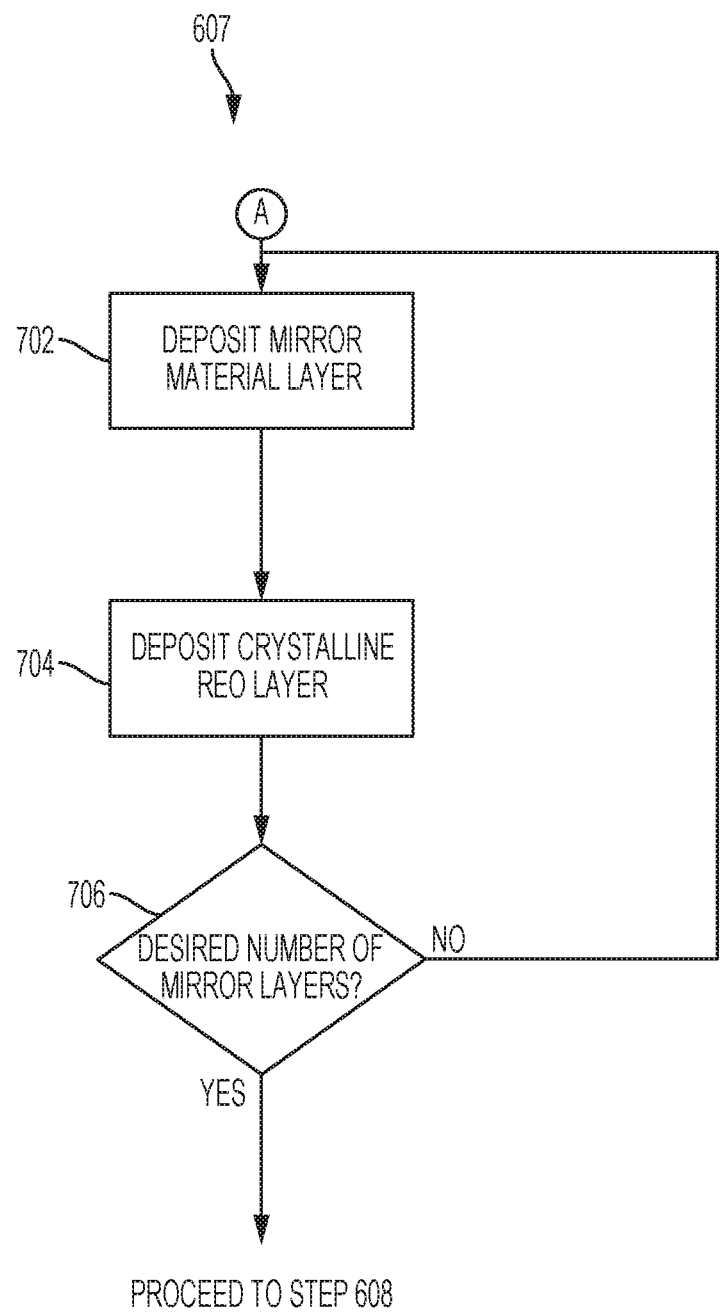
FIG. 7 depicts the method 607 for fabricating an acoustic mirror layer structure. At 702, a mirror material layer is deposited, according to an illustrative implementation.

FIG. 7 depicts the method 607 for fabricating an acoustic mirror layer structure. At 702, a mirror material layer is deposited. At 704, a crystalline REO layer is deposited over the mirror material layer. If, at 706, the desired number of mirror layers has been deposited, the method 607 proceeds to step 608 of the method 600. If, at 706, the desired number of mirror layers has not been reached, the method 600 returns to step 702 to deposit additional layers. While FIG. 7 depicts the mirror material layer deposited before the crystalline REO layer, the order of the layers can be reversed and the crystalline REO layer can be deposited before the mirror material layer.

Figure 8:
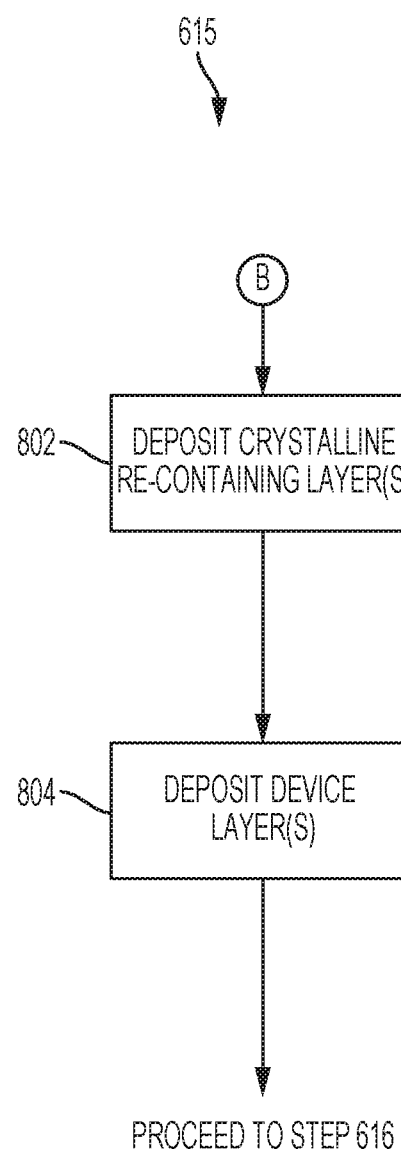
FIG. 8 depicts a flow chart of the method 615 for depositing overlying device layers, according to an illustrative implementation.

FIG. 8 depicts a flow chart of the method 615 for depositing overlying device layers. At 802, one or more crystalline rare earth-containing layers are deposited. At 804, one or more device layers are deposited over the one or more crystalline rare earth-containing layers. After step 804, the method proceeds to step 616 of the method 600.

A buried metal contact layer can be grown using epitaxial deposition of metal over a semiconductor layer. The epitaxial metal layer can be grown directly on the semiconductor layer and/or directly on a substrate. In some examples, an optional transitional layer can be between the epitaxial metal layer and the underlying semiconductor layer, and/or between the epitaxial metal layer and the underlying substrate. As well as the electrical advantages a buried contact layer would bring, there are often interactions between a metal and the overlying semiconductor that can be utilized. These interactions, such as in RF filters, are more useful when the interface between the metal and semiconductor (and any intervening interface) is high quality with few defects. In addition, epitaxial metals can be made thinner than sputtered metals while preserving high film quality. This is in part because epitaxial interfaces are higher quality, and as layers are thinned, the interfaces become a larger proportion of the overall material. Thus, while a thick film is less affected by poor quality interfaces and its properties are dominated by the bulk material properties, the properties of a thin film are more dominated by the interfacial properties. Thus, high quality interfaces are important when depositing thin films.

A crystalline rare earth oxide (REO) epitaxial layer can be used as a template for epitaxial metal on semiconducting substrates such as silicon. Substrates other than silicon can be used, and examples include germanium, Si—Ge alloys, sapphire, silicon dioxide, silicon-on-insulator (SOI), and silicon-on-semiconductor (SOS), substrates with a top layer of one of the above, and any semiconducting substrate. For the purpose of metal epitaxy, crystalline REO is a superior material compared to YSZ. For a start, the interface between the crystalline REO and the substrate is set as part of the epitaxial process. With the appropriate choice of rare earth oxide, crystalline REO templates can be epitaxially grown that are 100% (or nearly 100%) cubic with no secondary phase. Other parameters and process characteristics of crystalline REO that are beneficial to the overall epitaxial stacks are an oxide-silicon interface that is free of any parasitic charge, a higher density than YSZ (8.6 to 6.1 g/cm$^3$), and a 5× better thermal conductivity than YSZ. In addition to serving as a template for epitaxial metal growth, the crystalline REO layer can also prevent interdiffusion between the epitaxial metal layer and any substrate below. This crystalline REO layer 902 prevents the formation of, for example, unwanted metal silicides (where the substrate is silicon).

Figure 9:
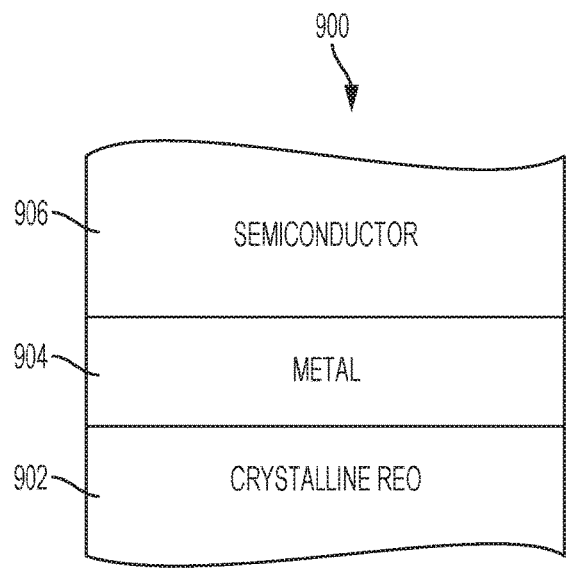
FIG. 9 depicts a layer structure 900 that includes an epitaxial metal layer 904 over a crystalline REO layer 902, and a semiconductor layer 906 over the epitaxial metal layer 904, according to an illustrative implementation.

FIG. 9 depicts a layer structure 900 that includes an epitaxial metal layer 904 over a crystalline REO layer 902, and a semiconductor layer 906 over the epitaxial metal layer 904. The thickness of the oxide is defined as $t_{ox}$ where typically the thickness of the oxide can be defined as $0 <= t_{ox} <= 500$ nm. The layer structure 900 depicted in FIG. 9 can be manufactured in a single epitaxial process, by MBE, MOCVD, or any of the other well-known epitaxial deposition techniques. As required, the tool can either be single chamber, or use any of the well-known cluster tool formats where specific parts of the process are done in different interconnected chambers, or multiple deposition tools can be used. The crystalline REO layer 902 is a template for the epitaxial metal layer 904, which can comprise one or more constituent epitaxial metal layers. The semiconductor layer 906 can comprise one or more of a III-nitride material, a III-V material, and a Group IV material. III-V materials include one or more species from Group III of the Periodic Table (such as B, Al, Ga, In, and Tl) and one or more species from Group V of the Periodic Table (such as N, P, As, Sb, and Bi). III-nitrides are III-V materials and include a species from Group III and nitrogen. Examples of III-nitride materials include GaN, $In_xAl_yGa_{1-x-y}N$ ($0 \le x$, $y \le 1$), and/or AlN. Examples of other III-V materials include one or more of GaAs, InP, InAs, InSb, InGaAs, GaAsP, InGaAsP, and the like.

The layer structure 900 depicted in FIG. 9 can be included in a radio-frequency (RF) filter. The semiconductor layer 906 can be a piezoelectric material that acts as a coupled electro-mechanical resonator. The epitaxial metal layer 904 can be a first electrode for the RF filter, and an optional second metal layer (not shown in FIG. 9) can be a second electrode for the RF filter. Epitaxial metal layers are particularly useful for electrodes in RF filters because they provide the high conductivity of metal with single-crystal structures that serve as templates for the subsequent growth of single-crystal layers (e.g., the semiconductor layer) over the metal layers. Due to the high conductivity, the metal layer can be thinner in comparison to the polycrystalline analogue. As the thickness of the piezoelectric layer is reduced to produce a higher frequency device, the metal contacts begin to limit the performance of the device. Therefore, it is desirable to make the metal layers as thin as possible while maintaining adequate conductivity. Single crystalline metals offer a route to reducing thickness and thereby improving device performance. Single-crystal semiconductor layers are useful as the semiconductor material in RF filters because they provide higher piezoelectric coefficients, narrower bandwidths, and lower losses. In part, the increased performance is due to quality and crystalline registry of the epitaxial metal electrodes, which results in the higher quality of subsequent films. The layer structure 900 of FIG. 9 can be grown epitaxially over a substrate such as a silicon substrate. If the semiconductor material in a filter is epitaxial, then it lends itself to integration of additional semiconductor elements (not necessarily directly electrically connected to the filter) that can be grown above the filter. For example, a transistor (examples of which include a field effect transistor, a high electron mobility transistor, and a heterojunction bipolar transistor) can be grown over the filter, thus reducing the chip area required for a given system.

Figure 10:
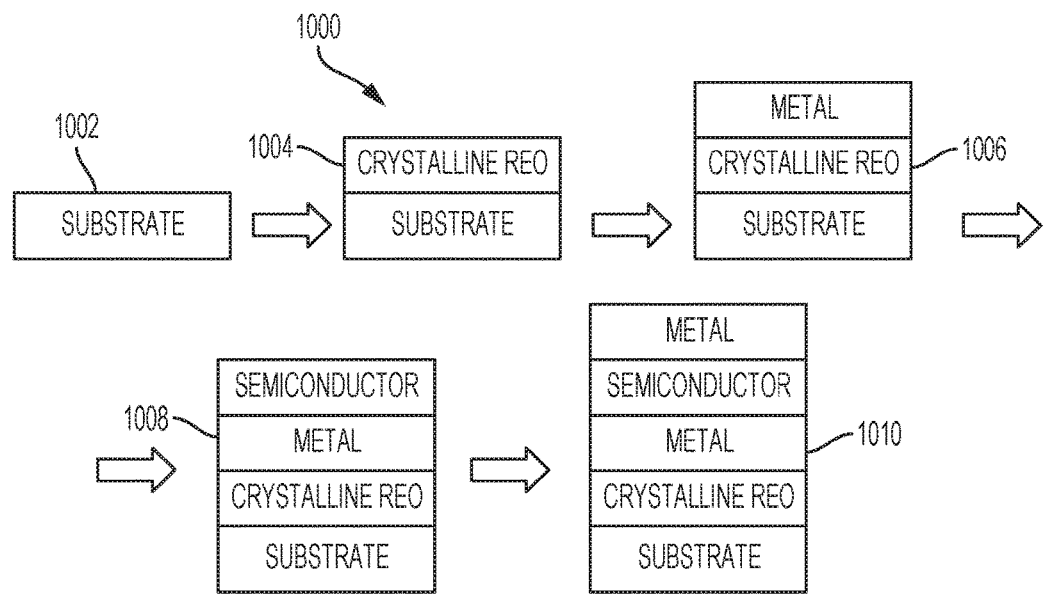
FIG. 10 depicts a process schematic 1000 that illustrates a single epitaxial process for fabricating the layer structure 900 depicted in FIG. 9, according to an illustrative implementation.

FIG. 10 depicts a process schematic 1000 that illustrates a single epitaxial process for fabricating the layer structure 900 depicted in FIG. 9. At 1004, a crystalline REO layer is epitaxially grown over a substrate. At 1006, a metal layer is epitaxially grown over the crystalline REO layer. At 1008, a semiconductor layer is epitaxially grown over the metal layer. In some examples, an additional metal layer can be epitaxially grown over the semiconductor layer, such as depicted at 1010. Each of the layers depicted in FIG. 1000 can include one or more sub-layers.

The epitaxial metal used could be a rare earth metal or a metal such as ruthenium or molybdenum, or other representative metals listed in Table 1 below. Key attributes to consider are resistivity, but also density, Young's modulus and refractive index which determine optical and acoustic properties of the layer. Other metals not listed in Table 1 can also be used.

TABLE 1

Representative metals and selected properties

| Metal | Crystal structure | Resistivity (nΩ-m) | Density (g/cm$^3$) | Young's modulus (GPa) | Refractive index @ 635 nm |
|---|---|---|---|---|---|
| ruthenium | hcp | 71 | 12.5 | 447 | |
| molybdenum | bcc | 53 | 10.3 | 329 | 3.71 |
| platinum | fcc | 105 | 21.5 | 168 | 2.33 |
| copper | fcc | 17 | 8.9 | 119 | 0.23 |
| aluminum | fcc | 28 | 2.7 | 70 | 1.39 |
| neodymium | dhcp | 643 | 7.0 | 41 | |
| gadolinium | hcp | 1310 | 7.9 | 55 | |
| erbium | hcp | 860 | 9.1 | 70 | |
| ytterbium | fcc | 250 | 6.9 | 24 | |
| scandium | hcp | 562 | 2.9 | 74 | |

(hcp—hexagonal close packed, fcc—face centered cubic, bcc—body centered cubic, dhcp—double hexagonal close packed)

Figure 11:
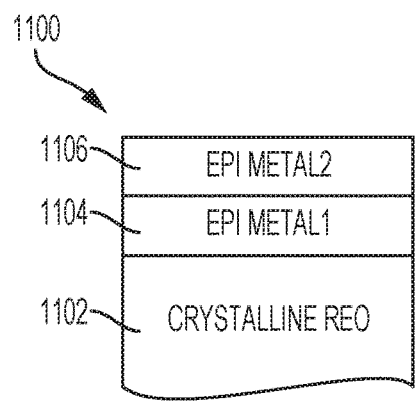
FIG. 11 depicts structures including multiple epitaxial metal layers over a crystalline REO template, according to an illustrative implementation.
Figure 11:
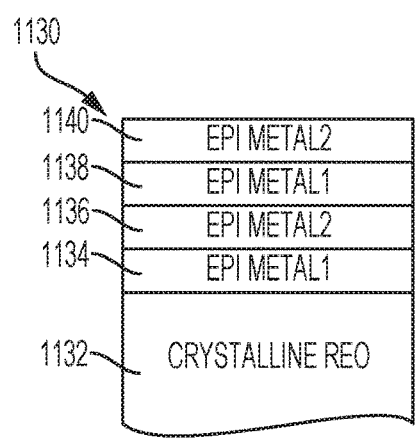
Figure 11:
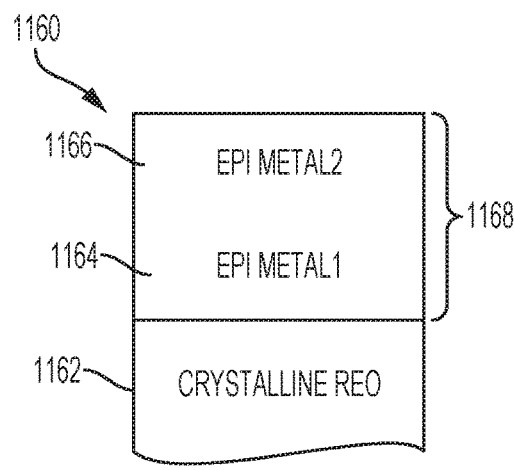

FIG. 11 depicts layer structures 1100, 1130, and 1160 that include multiple epitaxial metal layers over a crystalline REO template. The epitaxial metal layers in FIGS. 9 and 10 can include multiple metal layers. Multiple metal layers can be grown either as a stacked structure as such as in the layer structure 1100, in a superlattice or multi-layer structure such as in the layer structure 1130, or as a graded alloy such as in the layer structure 1160. The layer structure 1100 includes a crystalline REO layer 1102, and epitaxial metal 1 layer 1104 over the crystalline REO layer 1102, and an epitaxial metal 2 layer 1106 over the epitaxial metal 1 layer 1104. The layer structure 1130 includes a crystalline REO layer 1132, and epitaxial metal 1 layer 1134 over the crystalline REO layer 1132, and an epitaxial metal 2 layer 1136 over the epitaxial metal one layer 1134. The layer structure 1130 also includes an epitaxial metal 1 layer 1138 over the epitaxial metal 2 layer 1136, and an epitaxial metal 2 layer 1140 over the epitaxial metal 1 layer 1138. While the layer structure 1130 includes two pairs of epitaxial metal 1 and 2 layers, the layer structure 1130 can include a number of pairs of epitaxial metal 1 and 2 layers other than two. The layer structure 1160 includes a crystalline REO layer 1162 and a graded alloy 1168 over the crystalline REO layer 1162. The graded alloy 1168 is an alloy of epitaxial metal 1 1164 and epitaxial metal 2 1166.

The grading in the graded alloy 1168 can be linear (e.g., a linear change in composition from metal 1 1164 to metal 2 1166), superlinear (e.g., a higher order polynomial), sublinear, or stepwise (e.g., discrete changes in material composition). The metals 1104, 1134, and 1164 used adjacent to the crystalline REO 1102, 1132, and 1162 and/or the III-nitride can be the same, or they can be different. For example, a superlattice configuration can include alternating layers of different metals. The thicknesses of the layers of each of the metals can be the same, or they can be different.

Because the metal layers are epitaxial there is none of the loss associated with grain boundaries, and, additionally, the interfaces between the metal layers and the semiconductor are clean and discrete, both of which reduce the losses of a semiconductor—metal DBR when compared to a polycrystalline/sputtered DBR construct.

Figure 12:
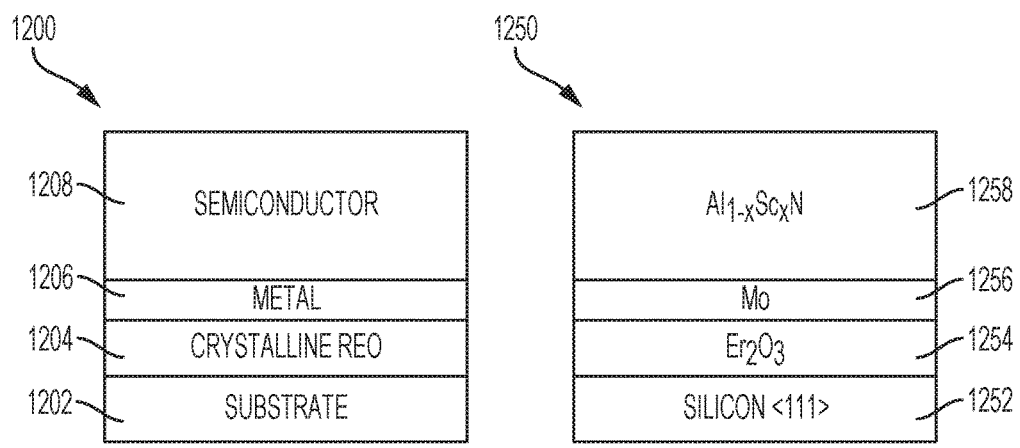
FIG. 12 depicts direct growth of a semiconductor layer over an epitaxial metal layer, and a representative example structure, where the semiconductor layer is a III-nitride layer, according to an illustrative implementation.

FIG. 12 depicts a layer structure 1200 with direct growth of a semiconductor layer over an epitaxial metal layer, and a representative example layer structure 1250, where the semiconductor layer is a III-nitride layer. The layer structure 1200 includes a crystalline REO layer 1204 epitaxially grown over a substrate 1202, a metal layer 1206 epitaxially grown over the crystalline REO layer 1204, and a semiconductor layer 1208 epitaxially grown over the metal layer

1206. The layer structure 1250 is a representative example of the layer structure 1200, where the semiconductor layer 1208 is a III-nitride layer, in particular an $Al_{1-x}Sc_xN$ ($0 \le x \le 1$) layer 1258, the metal layer 1206 is a Mo layer 1256, the crystalline REO layer 1204 is an $Er_2O_3$ layer 1254, and the substrate 1202 is a Si <111> substrate 1252. Other examples of the structure 1200 are possible, and each of the layers can include one or more sub-layers.

Interlayers can be used to improve the quality of interfaces between layers. The basic unit as shown in FIG. 9 can be modified to include an interlayer either between the metal 904 and semiconductor 906 or between the oxide 902 and the epitaxial metal 904. The purpose of such an interlayer is to allow chemical or crystallographic engineering of the transition from oxide to metal or metal to semiconductor. Chemical engineering can include encouraging nucleation or migration of the semiconductor or metal atoms during initial epitaxial deposition of the semiconductor 906 or metal layer 904. Crystallographic engineering can include aiding in a transition in crystal structure or lattice constant between the metal 904 and semiconductor 906 layers. An example of a transition in crystal structure is a transition from a hexagonal-type crystal structure to a cubic-type crystal structure.

Figure 13:
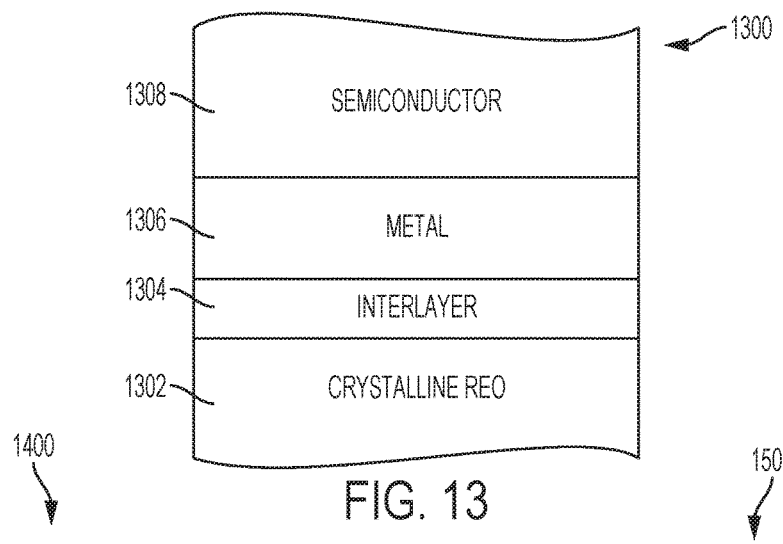
FIG. 13 depicts a layer structure 1300 that includes an epitaxial metal 1306 over an interlayer 1304 which itself is epitaxially grown over a crystalline REO layer 1302, according to an illustrative implementation.
Figure 14:
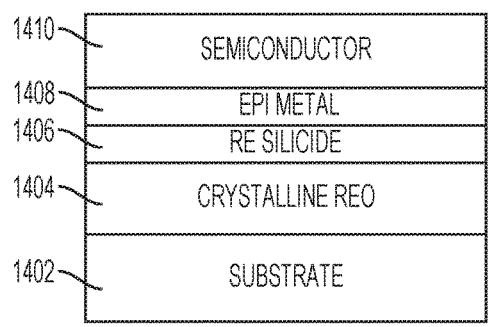
FIG. 14 depicts a layer structure 1400 that includes a substrate 1402, a crystalline REO layer 1404 over the substrate 1402, and a rare earth silicide layer 1406 over the crystalline REO layer 1404, according to an illustrative implementation.
Figure 15:
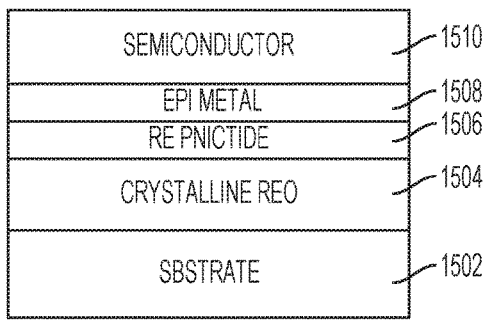
FIG. 15 depicts a layer structure 1500 that includes a substrate 1502, a crystalline REO layer 1504 over the substrate 1502, and a rare earth pnictide layer 1506 over the crystalline REO layer 1504, according to an illustrative implementation.

FIG. 13 depicts a layer structure 1300 that includes an epitaxial metal 1306 over an interlayer 1304 which itself is epitaxially grown over a crystalline REO layer 1302. FIGS. 14 and 15 depict examples of this interlayer. FIG. 14 shows a rare earth silicide whilst FIG. 15 is an example of a rare earth pnictide.

FIG. 14 depicts a layer structure 1400 that includes a substrate 1402, a crystalline REO layer 1404 over the substrate 1402, and a rare earth silicide layer 1406 over the crystalline REO layer 1404. The rare earth silicide layer 1406 is an example of the interlayer 1304. The layer structure 1400 also includes an epitaxial metal layer 1408 over the rare earth silicide layer 1406 and a semiconductor layer 1410 over the epitaxial metal layer 1404.

FIG. 15 depicts a layer structure 1500 that includes a substrate 1502, a crystalline REO layer 1504 over the substrate 1502, and a rare earth pnictide layer 1506 over the crystalline REO layer 1504. The rare earth pnictide layer 1506 is an example of the interlayer 1304. The layer structure 1500 also includes an epitaxial metal layer 1508 over the rare earth pnictide layer 1506, and a semiconductor layer 1510 over the epitaxial metal layer 1508.

Figure 16:
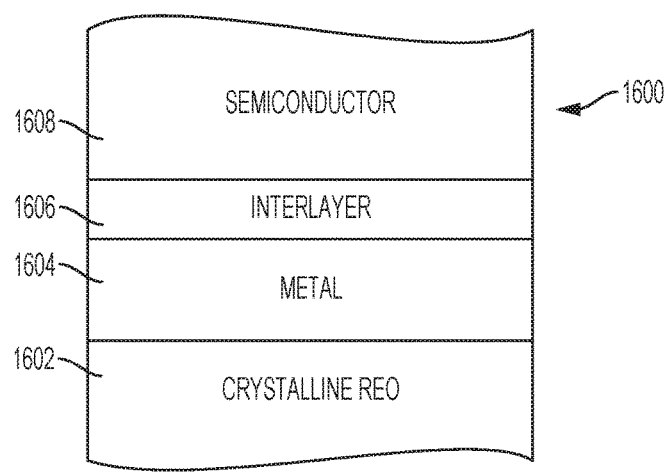
FIG. 16 depicts a layer structure 1600 that includes a crystalline REO layer 1602, an epitaxial metal layer 1604 over the crystalline REO layer 1602, an interlayer 1606 over the epitaxial metal layer 1604, and a semiconductor 1608 over the interlayer 1606, according to an illustrative implementation.

FIG. 16 depicts a layer structure 1600 that includes a crystalline REO layer 1602, and epitaxial metal layer 1604 over the crystalline REO layer 1602, and interlayer 1606 over the epitaxial metal layer 1604, and a semiconductor 1608 over the interlayer 1606. As depicted in FIG. 16, the interlayer 1606 can be above the epitaxial metal layer 1604.

Figure 17:
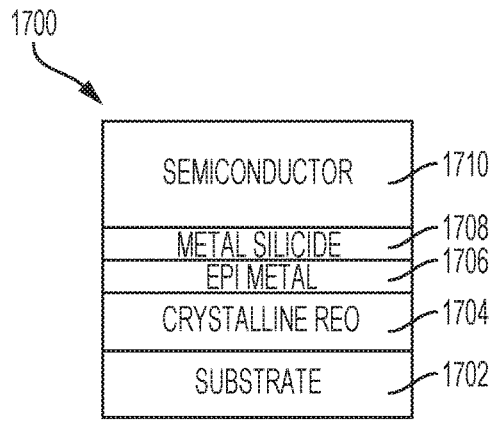
FIG. 17 depicts a layer structure 1700 that includes a metal silicide interlayer, according to an illustrative implementation.
Figure 18:
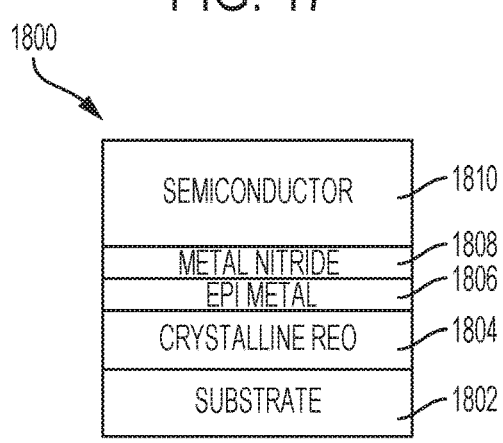
FIG. 18 depicts a layer structure 1800 that includes a metal nitride interlayer, according to an illustrative implementation.
Figure 19:
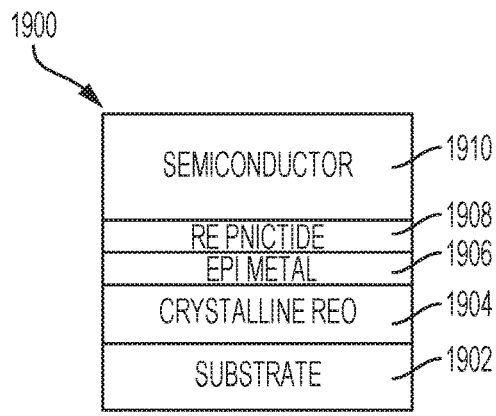
FIG. 19 depicts a layer structure 1900 that includes a rare earth pnictide interlayer, according to an illustrative implementation.

FIGS. 17-19 depict growth of interlayers. Examples of possible interlayers include (but are not limited too) metal silicide as shown in FIG. 17, metal nitride as shown in FIG. 18, rare earth nitride, rare earth arsenide, rare earth phosphide, rare earth antimonide, and rare earth bismuthide. The last five of these are commonly referred to as the rare earth pnictides and are shown in FIG. 19.

FIG. 17 depicts a layer structure 1700 that includes a metal silicide interlayer. The layer structure 1700 includes a substrate 1702, a crystalline REO layer 1704 over the substrate 1702, and epitaxial metal layer 1706 over the crystalline REO layer 1704, a metal silicide layer 1708 over the epitaxial metal layer 1706, and a semiconductor layer 1710 over the metal silicide layer 1708. The metal silicide layer 1708 is an example of the interlayer 1606.

FIG. 18 depicts a layer structure 1800 that includes a metal nitride interlayer. The layer structure 1800 includes a substrate 1802, a crystalline REO layer over the substrate 1802, and epitaxial metal layer 1806 over the crystalline REO layer 1804, an epitaxial metal layer nitride layer 1808 over the epitaxial metal layer 1806, and an epitaxial semiconductor layer 1810 over the epitaxial metal nitride 1808. The epitaxial metal nitride layer 1808 is an example of an interlayer 1606.

FIG. 19 depicts a layer structure 1900 that includes a rare earth pnictide interlayer. The layer structure 1900 includes a substrate 1902, a crystalline REO layer 1904 over the substrate 1902, an epitaxial metal layer 1906 over the crystalline REO layer 1904, an epitaxial rare earth pnictide layer 1908 over the epitaxial metal layer 1906, and an epitaxial semiconductor layer 1910 over the epitaxial rare earth pnictide layer 1908. The epitaxial rare earth pnictide layer 1908 is an example of the interlayer 1606.

At this point of the epitaxial process the first semiconductor material is fully grown and the layer is complete. For some applications this might be the end of the process, for others more semiconductors of different composition/types might be epitaxially grown over the other layers. In other applications, a second metal might be advantageous. For this example, any of the previously described metal epitaxy schemes can be utilized for this purpose. Likewise, any of the interlayers previously described that were epitaxially grown between the metal and the semiconductor could be used at this point of the overall epitaxial process depending on what features were required of the final epitaxial stack (see FIG. 16). The layers above the semiconductor do not have to match those below it—there is no requirement for a symmetrical design.

Figure 20:
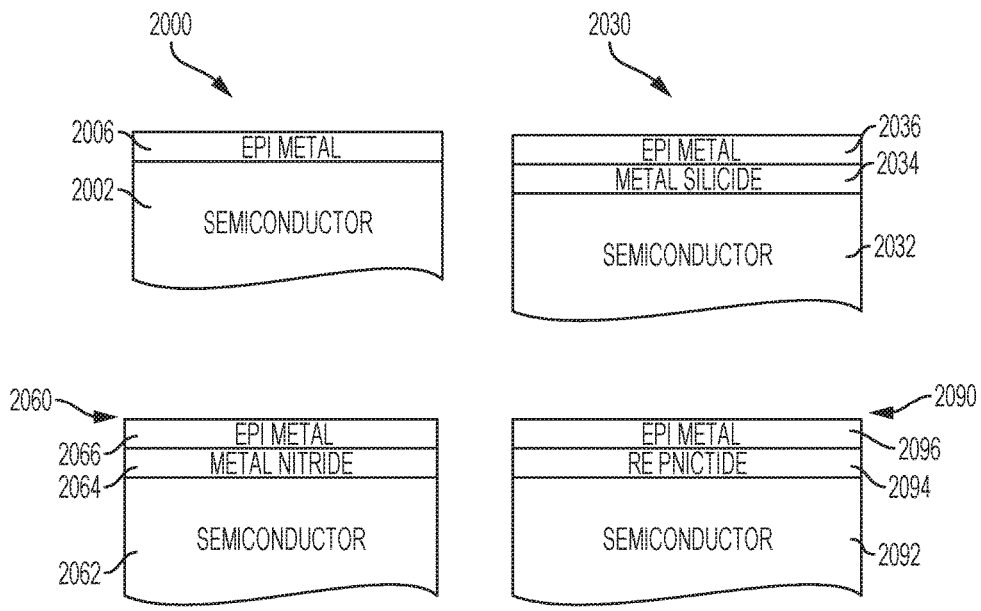
FIG. 20 depicts an epitaxial metal layer over a semiconductor layer, and three possible epitaxial interlayers, a metal silicide, a metal nitride, and a rare earth pnictide, according to an illustrative implementation.

FIG. 20 depicts a layer structure 2000 with an epitaxial metal layer over a semiconductor layer, and three examples of layer structures 2030, 2060, and 2090 with epitaxial interlayers, namely a metal silicide, a metal nitride, and a rare earth pnictide, respectively. The layer structure 2000 includes an epitaxial metal layer 2006 over a semiconductor layer 2002. The layer structure 2030 includes a semiconductor layer 2032, an epitaxial metal silicide layer 2034 over the semiconductor layer 2032, and an epitaxial metal layer 2036 over the epitaxial metal silicide layer 2034. The epitaxial metal silicide layer 2034 is an interlayer between metal and semiconductor layers. The layer structure 2060 includes a semiconductor layer 2062, an epitaxial metal nitride layer 2064 over the semiconductor layer 2062, and an epitaxial metal layer 2066 over the epitaxial metal nitride layer 2064. The epitaxial metal nitride layer 2064 is an example of an interlayer between metal and semiconductor layers. The layer structure 2090 includes a semiconductor layer 2092, an epitaxial rare earth pnictide layer 2094 over the semiconductor 2092, and an epitaxial metal layer 2096 over the epitaxial rare earth pnictide layer 2094.

The epitaxial rare earth pnictide 2094 is an example of an interlayer between metal and semiconductor layers. If the choice was made to grow a metal as shown in FIG. 20, then any or all of the above examples could be repeated for the purpose of epitaxially growing another semiconductor layer over metal. FIG. 20 depicts three examples of epitaxial interlayers, but other epitaxial interlayers can be used instead, or in combination.

Figure 21:
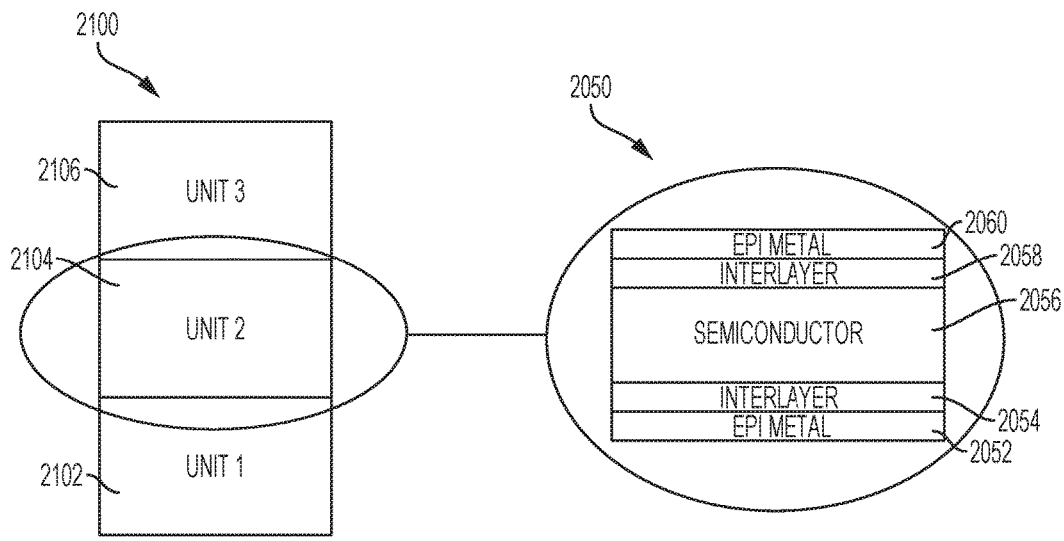
FIG. 21 depicts an example of repeated metal/semiconductor structures with optional interlayers, according to an illustrative implementation.

FIG. 21 depicts an example layer structure 2100 having repeated metal/semiconductor structures with optional interlayers. The layer structure 2100 includes three units 2102, 2104, and 2106. The layer structure 2100 can contain other numbers of units, but three are shown here for illustrative purposes. Each unit can be the same, or one or more of the units in a layer stack can be different. FIG. 21 also depicts an exemplary unit 2050 within the layer structure 2100. This exemplary unit 2050 contains a first interlayer 2054 epitaxially grown over a first epitaxial metal layer 2052, a semiconductor layer 2056 epitaxially grown over the first interlayer 2054, a second interlayer 2058 epitaxially grown over the semiconductor layer 2056, and a second epitaxial metal layer 2060 epitaxially grown over the second interlayer 2058. Any of the units within a layer structure can include none, one, or both of the first and second interlayers 2054 and 2058. In addition, the second epitaxial metal layer 2058 in one unit can be the same as the first epitaxial metal layer 2092 in the unit above. One or both of the epitaxial metal layers 2052 and 2060 in a unit can be a single metal, a graded metal layer, a metal layer with multiple sub-layers, and/or a superlattice with multiple metal layers.

Figure 22:
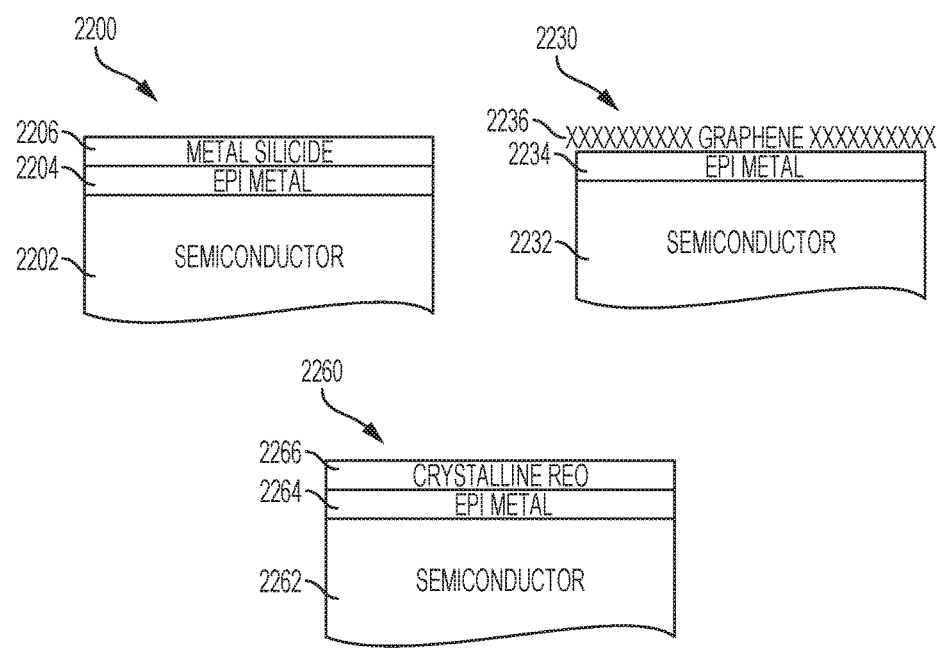
FIG. 22 depicts examples of final epitaxial layers to match the layers below to ex-situ processing and/or device operation, according to an illustrative implementation.

FIG. 22 depicts exemplary layer structures 2200, 2230, and 2260 having final epitaxial layers to match the layers below to ex-situ processing and/or device operation. These include, but are not limited to, the use of a metal silicide to protect the upper metal layer from oxidation as in the layer structure 2200, the addition of graphene or other 2D structures to enhance conductivity as in the layer structure 2230, a rare earth pnictide layer, and the addition of a crystalline REO layer either as a dielectric or an insulator to electrically isolate the underlying epitaxial stack as in the layer structure 2260. Note that, although these three uppermost layers are shown as single layer entities, it is expected that provision of such layers may require additional layers not shown here.

The layer structure 2200 includes a semiconductor layer 2202, an epitaxial metal layer 2204 over the semiconductor layer 2202, and an epitaxial metal silicide layer 2206 over the epitaxial metal layer 2204. The layer structure 2230 includes a semiconductor layer 2232, an epitaxial metal layer 2234 over the semiconductor layer 2232, and a graphene layer 2236 over the epitaxial metal layer 2234. Although not depicted, in 2230, the stack may include an additional semiconductor, metal, or insulator over the graphene layer in order to mechanically and chemically protect it. The layer structure 2260 includes a semiconductor layer 2262, an epitaxial metal layer 2264 over the semiconductor layer 2262, and a crystalline REO layer 2266 over the epitaxial metal layer 2264.

The growth and/or deposition described herein can be performed using one or more of chemical vapor deposition (CVD), metalorganic chemical vapor deposition (MOCVD), organometallic vapor phase epitaxy (OMVPE), atomic layer deposition (ALD), molecular beam epitaxy (MBE), halide vapor phase epitaxy (HVPE), pulsed laser deposition (PLD), and/or physical vapor deposition (PVD).

As described herein, a layer means a substantially uniform thickness of a material covering a surface. A layer can be either continuous or discontinuous (i.e., having gaps between regions of the material). For example, a layer can completely cover a surface, or be segmented into discrete regions, which collectively define the layer (i.e., regions formed using selective-area epitaxy). A layer substrate means a set of layers, and can be a stand alone structure or part of a larger structure.

"Monolithically-integrated" means formed on the surface of the substrate, typically by depositing layers disposed on the surface.

"Disposed" on means "exists on" an underlying material or layer. This layer may comprise intermediate layers, such as transitional layers, necessary to ensure a suitable surface. For example, if a material is described to be "disposed on a substrate," this can mean either (1) the material is in intimate contact with the substrate; or (2) the material is in contact with one or more transitional layers that reside on the substrate.

"Single-crystal" means a crystal structure that comprises substantially only one type of unit-cell. A single-crystal layer, however, may exhibit some crystal defects such as stacking faults, dislocations, or other commonly occurring crystal defects.

"Single-domain" means a crystalline structure that comprises substantially only one structure of unit-cell and substantially only one orientation of that unit cell. In other words, a single-domain crystal exhibits no twinning or anti-phase domains.

"Single-phase" means a crystal structure that is both single-crystal and single-domain.

"Crystalline" means a crystal structure that is substantially single-crystal and substantially single-domain. Crystallinity means the degree to which a crystal structure is single-crystal and single-domain. A highly crystalline structure would be almost entirely, or entirely single-crystal and single-domain.

"Amorphous" means a material without long-range order.

"Substrate" means the material on which deposited layers are formed. Exemplary substrates include, without limitation: bulk silicon wafers, in which a wafer comprises a homogeneous thickness of single-crystal silicon; composite wafers, such as a silicon-on-insulator wafer that comprises a layer of silicon that is disposed on a layer of silicon dioxide that is disposed on a bulk silicon handle wafer; or any other material that serves as a base layer upon which, or in which, devices are formed. Examples of such other materials that are suitable, as a function of the application, for use as substrate layers and bulk substrates include, without limitation, germanium, alumina, gallium-arsenide, indium-phosphide, silica, silicon dioxide, borosilicate glass, pyrex, and sapphire.

"Miscut Substrate" means a substrate which comprises a surface crystal structure that is oriented at an angle to that associated with the crystal structure of the substrate. For example, a 6° miscut <100> silicon wafer comprises a <100> silicon wafer that has been cut at an angle to the <100> crystal orientation by 6° toward another major crystalline orientation, such as <110>. Typically, but not necessarily, the miscut will be up to about 20°. Unless specifically noted, the phrase "miscut substrate" includes miscut wafers having any major crystal orientation. That is, a <111> wafer miscut toward the <011> direction, a <100> wafer miscut toward the <110> direction, and a <011> wafer miscut toward the <001> direction.

"Semiconductor-on-Insulator" means a composition that comprises a single-crystal semiconductor layer, a single-phase dielectric layer, and a substrate, wherein the dielectric layer is interposed between the semiconductor layer and the substrate. This structure is reminiscent of prior-art silicon-on-insulator ("SOI") compositions, which typically include a single-crystal silicon substrate, a non-single-phase dielectric layer (e.g., amorphous silicon dioxide, etc.) and a single-crystal silicon semiconductor layer. Several important distinctions between prior-art SOI wafers and the inventive semiconductor-on-insulator compositions are that:

Semiconductor-on-insulator compositions include a dielectric layer that has a single-phase morphology, whereas SOI wafers do not. In fact, the insulator layer of typical SOI wafers is not even single crystal.

Semiconductor-on-insulator compositions include a silicon, germanium, or silicon-germanium "active" layer, whereas prior-art SOI wafers use a silicon active layer. In other words, exemplary semiconductor-on-insulator compositions include, without limitation: silicon-on-insulator, germanium-on-insulator, and silicon-germanium-on-insulator.

"Electrode" means a conductive material that is used to make contact with a part of a circuit. Electrodes can be made of metals, semimetals, semiconductors, silicides, nitrides, and nonmetals, but are more conductive than the part of the circuit they are contacting.

A first layer described and/or depicted herein as "on" or "over" a second layer can be immediately adjacent to the second layer, or one or more intervening layers can be between the first and second layers. A first layer that is described and/or depicted herein as "directly on" or "directly over" a second layer or a substrate is immediately adjacent to the second layer or substrate with no intervening layer present, other than possibly an intervening alloy layer that may form due to mixing of the first layer with the second layer or substrate. In addition, a first layer that is described and/or depicted herein as being "on," "over," "directly on," or "directly over" a second layer or substrate may cover the entire second layer or substrate, or a portion of the second layer or substrate.

A substrate is placed on a substrate holder during layer growth, and so a top surface or an upper surface is the surface of the substrate or layer furthest from the substrate holder, while a bottom surface or a lower surface is the surface of the substrate or layer nearest to the substrate holder. Any of the structures depicted and described herein can be part of larger structures with additional layers above and/or below those depicted. For clarity, the figures herein can omit these additional layers, although these additional layers can be part of the structures disclosed. In addition, the structures depicted can be repeated in units, even if this repetition is not depicted in the figures.

From the above description it is manifest that various techniques may be used for implementing the concepts described herein without departing from the scope of the disclosure. The described embodiments are to be considered in all respects as illustrative and not restrictive. It should also be understood that the techniques and structures described herein are not limited to the particular examples described herein, but can be implemented in other examples without departing from the scope of the disclosure. Similarly, while operations are depicted in the drawings in a particular order, this should not be understood as requiring that such operations be performed in the particular order shown or in sequential order, or that all illustrated operations be performed, to achieve desirable results.

What is claimed is:

1. A layer structure, comprising:
   an epitaxial crystalline rare earth oxide (REO) layer over a substrate;
   a first epitaxial electrode layer directly over the crystalline REO layer;
   an epitaxial piezoelectric layer over the first epitaxial electrode layer;
   a second epitaxial crystalline rare earth (RE)-containing layer over the epitaxial piezoelectric layer; and
   one or more device layers over the second epitaxial crystalline RE-containing layer.

2. The layer structure of claim 1, further comprising a second electrode layer over the epitaxial piezoelectric layer.

3. The layer structure of claim 1, wherein the first electrode layer comprises epitaxial metal.

4. The layer structure of claim 3, wherein the epitaxial metal is single-crystal.

5. The layer structure of claim 1, wherein the first electrode layer comprises a rare earth pnictide.

6. The layer structure of claim 1, wherein the first electrode layer comprises a rare earth silicide (RESi).

7. The layer structure of claim 1, further comprising an amorphous oxide layer between the epitaxial crystalline rare earth oxide layer and the substrate.

8. The layer structure of claim 1, further comprising an acoustic mirror structure between the epitaxial crystalline REO layer and the substrate, wherein the acoustic mirror structure comprises alternating crystalline REO and mirror material layers.

9. The layer structure of claim 1, wherein the epitaxial piezoelectric layer comprises at least one of aluminum nitride and aluminum scandium nitride.

10. The layer structure of claim 1, wherein the second epitaxial crystalline RE-containing layer comprises a REO.

11. The layer structure of claim 1, wherein the second epitaxial crystalline RE-containing layer comprises a rare earth pnictide.

12. The layer structure of claim 1, wherein the second epitaxial crystalline RE-containing layer comprises a RESi.

13. The layer structure of claim 1, wherein a density of the crystalline REO layer is between approximately $5 \times 10^3$ kg/m$^3$ and approximately $15 \times 10^3$ kg/m$^3$.

14. The layer structure of claim 1, wherein a density of the crystalline REO layer is between approximately $7 \times 10^3$ kg/m$^3$ and approximately $10 \times 10^3$ kg/m$^3$.

15. The layer structure of claim 1, wherein the one or more device layers comprise one or more high electron mobility transistor (HEMT) layers.

16. The layer structure of claim 1, wherein the one or more device layers comprise one or more heterojunction bipolar transistor (HBT) layers.

17. The layer structure of claim 1, wherein the one or more device layers comprise one or more pseudomorphic HEMT (pHEMT) layers.

18. The layer structure of claim 1, wherein the first electrode layer comprises a compositionally graded layer.

19. The layer structure of claim 1, wherein the first electrode layer comprises a multi-layer structure.

20. The layer structure of claim 1, further comprising at least one of a rare earth pnictide layer and a RESi layer adjacent to the first electrode layer.

21. The layer structure of claim 1, wherein the substrate comprises a silicon substrate.

22. The layer structure of claim 1, wherein the substrate comprises a silicon carbide substrate.

23. The layer structure of claim 1, wherein the substrate comprises a sapphire substrate.

24. A method of fabricating a layer structure, comprising:
   depositing an epitaxial crystalline rare earth oxide (REO) layer over a substrate;
   depositing a first epitaxial electrode layer directly over the crystalline REO layer;
   depositing an epitaxial piezoelectric layer over the first epitaxial electrode layer;
   depositing a second epitaxial crystalline rare earth (RE)-containing layer over the epitaxial piezoelectric layer; and
   depositing one or more device layers over the second epitaxial crystalline RE-containing layer.

25. The method of claim 24, further comprising depositing a second electrode layer over the epitaxial piezoelectric layer.

26. The method of claim 24, wherein the first electrode layer comprises epitaxial metal.

27. The method of claim 26, wherein the epitaxial metal is single-crystal.

28. The method of claim 24, wherein the first electrode layer comprises a rare earth pnictide.

29. The method of claim 24, wherein the first electrode layer comprises a rare earth silicide (RESi).

30. The method of claim 24, further comprising depositing an amorphous oxide layer between the epitaxial crystalline rare earth oxide layer and the substrate.

31. The method of claim 24, further comprising depositing an acoustic mirror structure between the epitaxial crystalline REO layer and the substrate, wherein the acoustic mirror structure comprises alternating crystalline REO and mirror material layers.

32. The method of claim 24, wherein the epitaxial piezoelectric layer comprises at least one of aluminum nitride and aluminum scandium nitride.

33. The method of claim 24, wherein the second epitaxial crystalline RE-containing layer comprises a REO.

34. The method of claim 24, wherein the second epitaxial crystalline RE-containing layer comprises a rare earth pnictide.

35. The method of claim 24, wherein the second epitaxial crystalline RE-containing layer comprises a RESi.

36. The method of claim 24, wherein a density of the crystalline REO layer is between approximately $5 \times 10^3$ kg/m$^3$ and approximately $15 \times 10^3$ kg/m$^3$.

37. The method of claim 24, wherein a density of the crystalline REO layer is between approximately $7 \times 10^3$ kg/m$^3$ and approximately $10 \times 10^3$ kg/m$^3$.

38. The method of claim 24, wherein the one or more device layers comprise one or more high electron mobility transistor (HEMT) layers.

39. The method of claim 24, wherein the one or more device layers comprise one or more heterojunction bipolar transistor (HBT) layers.

40. The method of claim 24, wherein the one or more device layers comprise one or more pseudomorphic HEMT (pHEMT) layers.

41. The method of claim 24, wherein the first electrode layer comprises a compositionally graded layer.

42. The method of claim 24, wherein the first electrode layer comprises a multi-layer structure.

43. The method of claim 24, further comprising depositing at least one of a rare earth pnictide layer and a RESi layer adjacent to the first electrode layer.

44. The method of claim 24, wherein the substrate comprises a silicon substrate.

45. The method of claim 24, wherein the substrate comprises a silicon carbide substrate.

46. The method of claim 24, wherein the substrate comprises a sapphire substrate.

47. A layer structure, comprising:
an epitaxial crystalline rare earth oxide (REO) layer over a substrate;
a first epitaxial electrode layer directly over the crystalline REO layer;
an epitaxial piezoelectric layer over the first epitaxial electrode layer; and
an acoustic mirror structure between the epitaxial crystalline REO layer and the substrate, wherein the acoustic mirror structure comprises alternating crystalline REO and mirror material layers.

* * * * *